(12) United States Patent
Chen et al.

(10) Patent No.: US 12,040,757 B2
(45) Date of Patent: Jul. 16, 2024

(54) AMPLIFIER CIRCUIT

(71) Applicant: RichWave Technology Corp., Taipei (TW)

(72) Inventors: Chih-Sheng Chen, Taipei (TW); Ching-Wen Hsu, Taipei (TW); Hsien-Wei Ke, Taipei (TW)

(73) Assignee: RichWave Technology Corp., Taipei (TW)

(*) Notice: Subject to any disclaimer, the term of this patent is extended or adjusted under 35 U.S.C. 154(b) by 436 days.

(21) Appl. No.: 17/378,802

(22) Filed: Jul. 19, 2021

(65) Prior Publication Data
US 2021/0351749 A1    Nov. 11, 2021

Related U.S. Application Data

(63) Continuation-in-part of application No. 16/509,450, filed on Jul. 11, 2019, now Pat. No. 11,108,366.

(30) Foreign Application Priority Data

Oct. 3, 2018  (TW) ................................ 107134884

(51) Int. Cl.
*H03F 3/21* (2006.01)
*H03F 3/72* (2006.01)
*H03F 1/56* (2006.01)

(52) U.S. Cl.
CPC ............. *H03F 3/211* (2013.01); *H03F 3/72* (2013.01); *H03F 1/565* (2013.01);
(Continued)

(58) Field of Classification Search
CPC . H03F 3/211; H03F 3/72; H03F 1/565; H03F 2200/111; H03F 2200/222;
(Continued)

(56) References Cited

U.S. PATENT DOCUMENTS 6,181,206 B1    1/2001    Palmisano
6,657,498 B2    12/2003   Park
(Continued)

FOREIGN PATENT DOCUMENTS

| | | |
|---|---|---|
| CN | 103107791 B | 3/2015 |
| TW | I499200 B | 9/2015 |
| WO | 2008102788 A1 | 8/2008 |

*Primary Examiner* — Hieu P Nguyen
(74) *Attorney, Agent, or Firm* — Winston Hsu

(57) ABSTRACT

An amplifier circuit includes a first amplifier and a second amplifier. The first amplifier receives a first signal and generates a first amplification signal accordingly. The second amplifier receives a second signal and generates a second amplification signal accordingly. The first signal is related to a first frequency band, and the second signal is related to a second frequency band different from the first frequency band. When one of the first amplifier and the second amplifier is in use, the other one of the first amplifier and the second amplifier is unused. The first amplifier and second amplifier are coupled to a reference voltage terminal through a common node. The first amplifier includes a switch coupled between the common node and a stage of the first amplifier, and the switch can be controlled for reducing the loading effect caused by the first amplifier on the second amplifier.

17 Claims, 13 Drawing Sheets

(52) U.S. Cl.
CPC .. *H03F 2200/111* (2013.01); *H03F 2200/222* (2013.01); *H03F 2200/372* (2013.01); *H03F 2200/387* (2013.01); *H03F 2203/7209* (2013.01)

(58) Field of Classification Search
CPC ......... H03F 2200/372; H03F 2200/387; H03F 2203/7209; H03F 2203/7236; H03F 1/223; H03F 1/0277
USPC ........................ 330/51, 124 R, 295, 310–311
See application file for complete search history.

(56) References Cited

U.S. PATENT DOCUMENTS

| | | |
|---|---|---|
| 6,756,848 B2 | 6/2004 | Garcia |
| 7,023,272 B2 | 4/2006 | Hung |
| 7,352,247 B2 | 4/2008 | Oh |
| 7,719,352 B2 * | 5/2010 | Kim .......................... H03F 3/72 330/307 |
| 8,102,213 B2 | 1/2012 | Tasic |
| 8,175,566 B2 | 5/2012 | Tasic |
| 8,698,560 B2 | 4/2014 | Li |
| 8,729,966 B2 | 5/2014 | Takagi |
| 9,059,665 B2 | 6/2015 | Youssef |
| 9,184,707 B2 | 11/2015 | Rangarajan |
| 10,050,653 B2 | 8/2018 | Pehlivanoglu |
| 2006/0022748 A1 | 2/2006 | Udagawa |
| 2006/0119435 A1 | 6/2006 | Oh |
| 2007/0296507 A1 | 12/2007 | Hamaguchi |
| 2009/0085668 A1 | 4/2009 | Gao |
| 2013/0315348 A1 | 11/2013 | Tasic |
| 2016/0204966 A1 | 7/2016 | Kim |
| 2019/0372528 A1 | 12/2019 | Pal |

* cited by examiner

AMPLIFIER CIRCUIT

CROSS REFERENCE TO RELATED APPLICATION

This is a continuation-in-part (CIP) application of U.S. application Ser. No. 16/509,450 filed on 2019 Jul. 11, which is included and incorporated herein by reference in its entirety.

TECHNICAL FIELD

The disclosure is related to an amplifier circuit, and more particularly, an amplifier circuit supporting various operation modes.

BACKGROUND

In the field of communications, it is necessary to use the amplifier circuit that supports multiple modes and multiple frequency bands. For example, if signals of different frequency bands have to be processed, multiple amplifiers can be used in the amplifier circuit for receiving and amplifying signals of different frequency bands respectively.

However, since multiple amplifiers in an amplifier circuit are coupled to one another, when an amplifier corresponding to one frequency band is in use and another amplifier corresponding to another frequency band is not in use, the unused amplifier would cause a load effect to the amplifier in use, and the performance of the amplifier in use is therefore deteriorated.

In order to reduce the load effect, external passive components coupled to the amplifier circuit could be installed on the circuit board, resulting in high costs. In addition, in order to reduce the load effect sufficiently, it is difficult to reduce the size of the external passive components.

SUMMARY

An embodiment provides an amplifier circuit comprising a first power amplifier and a second power amplifier. The first power amplifier comprises a first output terminal and a first amplification stage. The first output terminal of the first power amplifier is configured to output a first amplification signal. The first amplification stage of the first power amplifier comprises a first transistor and a first switch, where the first transistor comprises a control terminal configured to receive a first input signal, a first terminal coupled to the first output terminal and configured to output an amplified first input signal, and a second terminal; and the first switch comprises a first terminal, and a second terminal coupled to the first terminal of the first transistor. The second power amplifier comprises a second output terminal and a first amplification stage. The second output terminal of the second power amplifier is configured to output a second amplification signal. The first amplification stage of the second power amplifier comprises a second transistor, where the second transistor comprises a control terminal configured to receive a second input signal, a first terminal coupled to the second output terminal and configured to output an amplified second input signal, and a second terminal.

DETAILED DESCRIPTION

Figure 1:
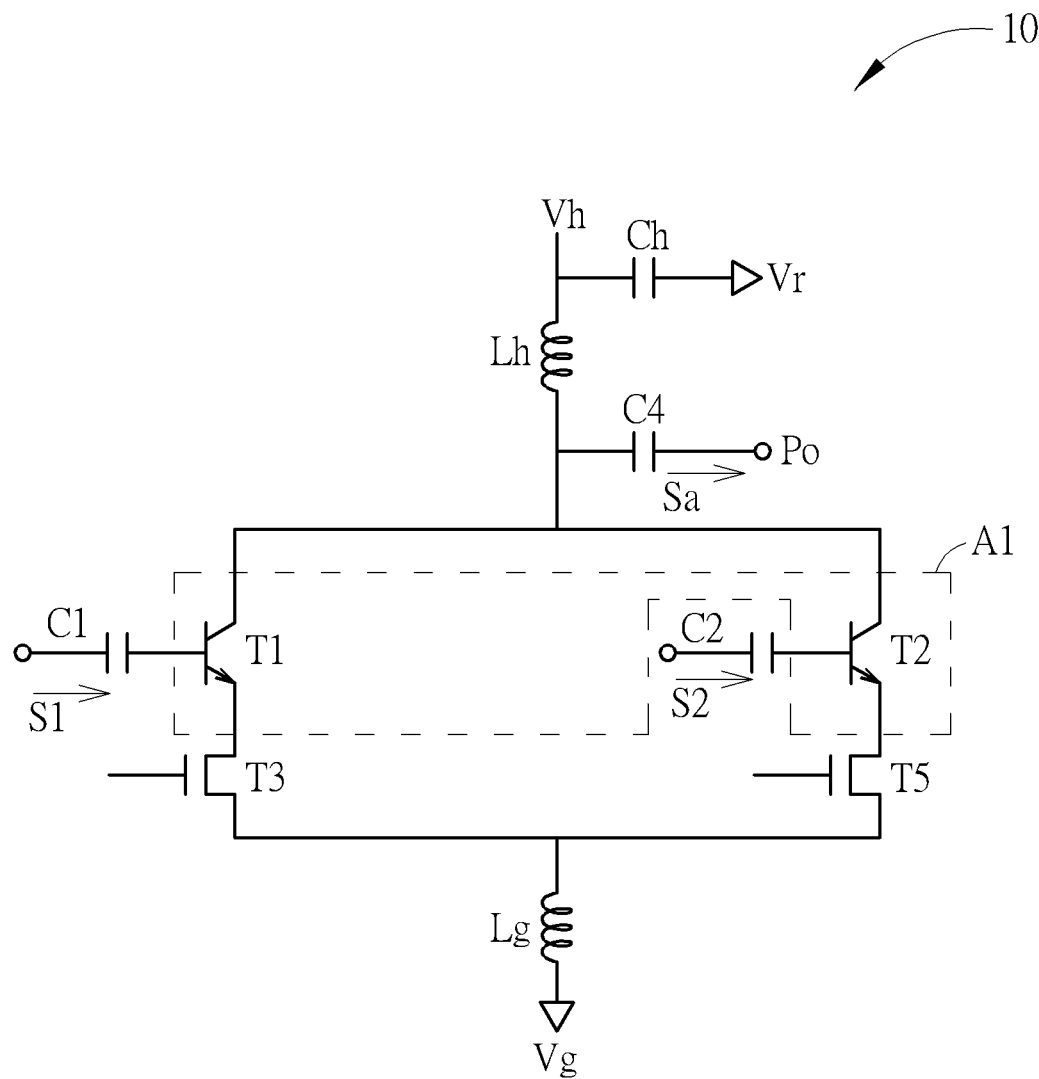
FIG. 1 illustrates an amplifier circuit according to an embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates an amplifier circuit 100 according to an embodiment. The amplifier circuit 100 may include an amplification unit A1. The amplification unit A1 may include transistors T1 and T2. The transistor T1 may include a control terminal, a first terminal and a second terminal, where the control terminal is used as a first input terminal of the amplifier circuit 100 for receiving an input signal S1, the first terminal may be coupled to an output terminal Po for outputting an amplified input signal S1. The transistor T2 may include a control terminal, a first terminal and a second terminal, where the control terminal is used as a second input terminal of the amplifier circuit 100 for receiving an input signal S2, and the first terminal may be coupled to the output terminal Po for outputting an amplified input signal S2. The output terminal Po may be used to output an amplification signal Sa, and the amplification signal Sa may be generated using at least the amplified input signal S1 and/or the amplified input signal S2.

As shown in FIG. 1, the amplifier circuit 100 may optionally further include switches T3 and T5. The switch T3 may include a first terminal and a second terminal, where the first terminal is coupled to the second terminal of the transistor T1. The switch T5 may include a first terminal and a second terminal, where the first terminal may be coupled to the second terminal of the transistor T2. The amplifier circuit 100 may optionally further include capacitors C1, C2 and C4. The capacitor C1 may be coupled to the control terminal of the transistor T1. The capacitor C2 may be coupled to the control terminal of the transistor T2. The capacitor C4 may be coupled between the output terminal Po and the first terminal of the transistor T1 and be coupled between the output terminal Po and the first terminal of the transistor T2. The capacitors C1, C2 and C4 may be DC (direct-current) blocking capacitors. When a component is described to be optionally included in a circuit, it is allowed to determine whether the component is included in the circuit as needed, and it is within the scope of embodiments no matter the component is included or is not included in the circuit. Furthermore, when it is described herein to optionally include a plurality of components, for example, when it is described to optionally include components A, B and C, it is meant to optionally include at least one of the components A, B and C; optionally include a plurality of ones (such as two or more) of the components A, B and C; or include none of the components A, B, and C. All abovementioned conditions are within the scope of embodiments.

According to an embodiment, the amplifier circuit 100 may further include inductors Lh and Lg and a capacitor Ch. The inductor Lh may include a first terminal and a second terminal, where the first terminal may be coupled to a voltage terminal Vh, and the second terminal may be coupled to the first terminal of the transistor T1 and the first terminal of the transistor T2. The inductor Lg may include a first terminal and a second terminal, where the first terminal may be coupled to the second terminal of the switch T3 and the second terminal of the switch T5, and the second terminal may be coupled to a voltage terminal Vg. The inductors Lh and Lg may be used to provide impedance matching. The capacitor Ch may be coupled between the voltage terminal Vh and a reference voltage terminal Vr. The reference voltage terminal Vr may be used to receive a reference voltage. The capacitor Ch may be an AC (alternating current) short capacitor for allowing AC signals to pass through. The voltage terminals Vh and Vg may be different reference voltage terminals. For example, the voltage terminal Vh may be a supply voltage terminal, and the voltage terminal Vg may be a ground terminal. The reference voltage terminal Vr may be (but not limited to) the voltage terminal Vg.

According to the embodiment of FIG. 1, when the amplifier circuit 100 is used to amplify the input signal S1, the amplification signal Sa is generated using the amplified input signal S1, the transistor T1 and the switch T3 may be turned on, and the transistor T2 and the switch T5 may be turned off. Because the second terminal of the transistor T1 and the second terminal of the transistor T2 may form a common structure, the turned-off switch T5 may make it difficult for the input signal S1 to leak to the transistor T2 through the turned-on switch T3, and unwanted conduction caused by the input signal S1 changing a voltage between the control terminal and the second terminal of the transistor T2 may be reduced. Hence, it may be reduced that the control terminal of the transistor T1 and the control terminal of the transistor T2 interfere with one another. In other words, the isolation between the first input terminal and the second input terminal of the amplifier circuit 100 may be improved. Furthermore, because there may exist a parasitic capacitor between the first terminal and the second terminal of the turned-off transistor T2, the turned-off switch T5 may make it difficult for the input signal S1 to leak to the output terminal Po through the parasitic capacitor of the turned-off transistor T2. Hence, the interference with the output terminal Po may be reduced where the interference is caused by the input signal S1 leaking through the parasitic capacitor of the turned-off transistor T2. In other words, the influence caused by unused paths of the amplifier circuit 100 upon the output terminal Po may be reduced. Likewise, when the amplifier circuit 100 is used to amplify the input signal S2, the amplification signal Sa is generated using the amplified input signal S2, the transistor T1 and the switch T3 may be turned off, and the transistor T2 and the switch T5 may be turned on. Because the second terminal of the transistor T1 and the second terminal of the transistor T2 may form a common structure, the turned-off switch T3 may make it difficult for the input signal S2 to leak to the transistor T1 through the turned-on switch T5, and unwanted conduction caused by the input signal S2 changing a voltage between the control terminal and the second terminal of the transistor T1 may be reduced. Hence, it may be reduced that the control terminal of the transistor T2 and the control terminal of the transistor T1 interfere with one another. In other words, the isolation between the first input terminal and the second input terminal of the amplifier circuit 100 may be improved. Furthermore, because there may exist a parasitic capacitor between the first terminal and the second terminal of the turned-off transistor T1, the turned-off switch T3 may make it difficult for the input signal S2 to leak to the output terminal Po through the parasitic capacitor of the turned-off transistor T1. Hence, the interference with the output terminal Po may be reduced where the interference is caused by the input signal S2 leaking through the parasitic capacitor of the turned-off transistor T1. In other words, the influence caused by unused paths of the amplifier circuit 100 upon the output terminal Po may be reduced.

Figure 2:
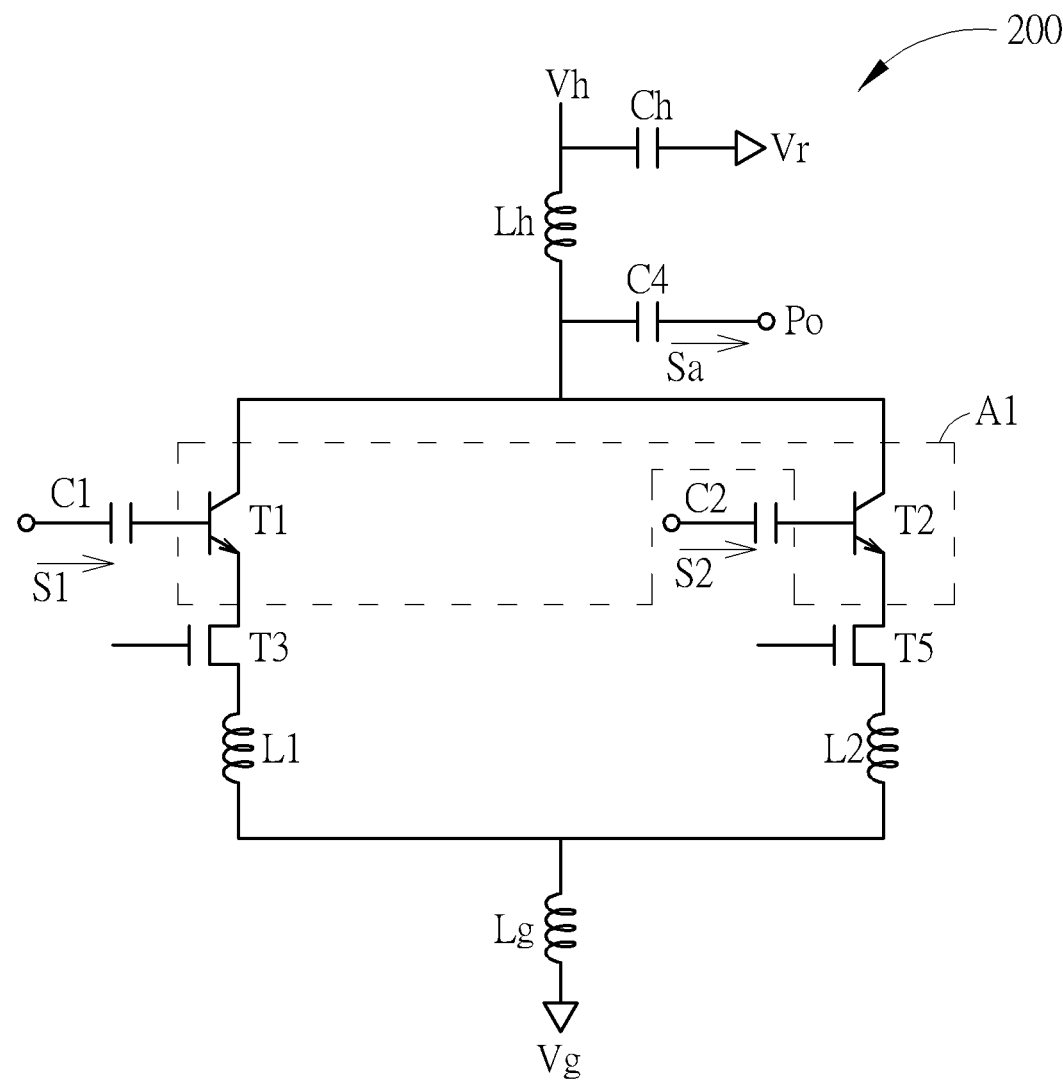
FIG. 2 illustrates an amplifier circuit according to another embodiment.

FIG. 2 illustrates an amplifier circuit 200 according to another embodiment. The amplifier circuit 200 may be similar to the amplifier circuit 100, but the amplifier circuit 200 may optionally include inductors L1 and L2. The inductor L1 may be coupled between the second terminal of the switch T3 and the first terminal of the inductor Lg. The inductor L2 may be coupled between the second terminal of the switch T5 and the first terminal of the inductor Lg. The inductors L1 and L2 may be used to respectively adjust impedance of a first input terminal of the amplifier circuit 200 and impedance of a second input terminal of the amplifier circuit 200.

Figure 3:
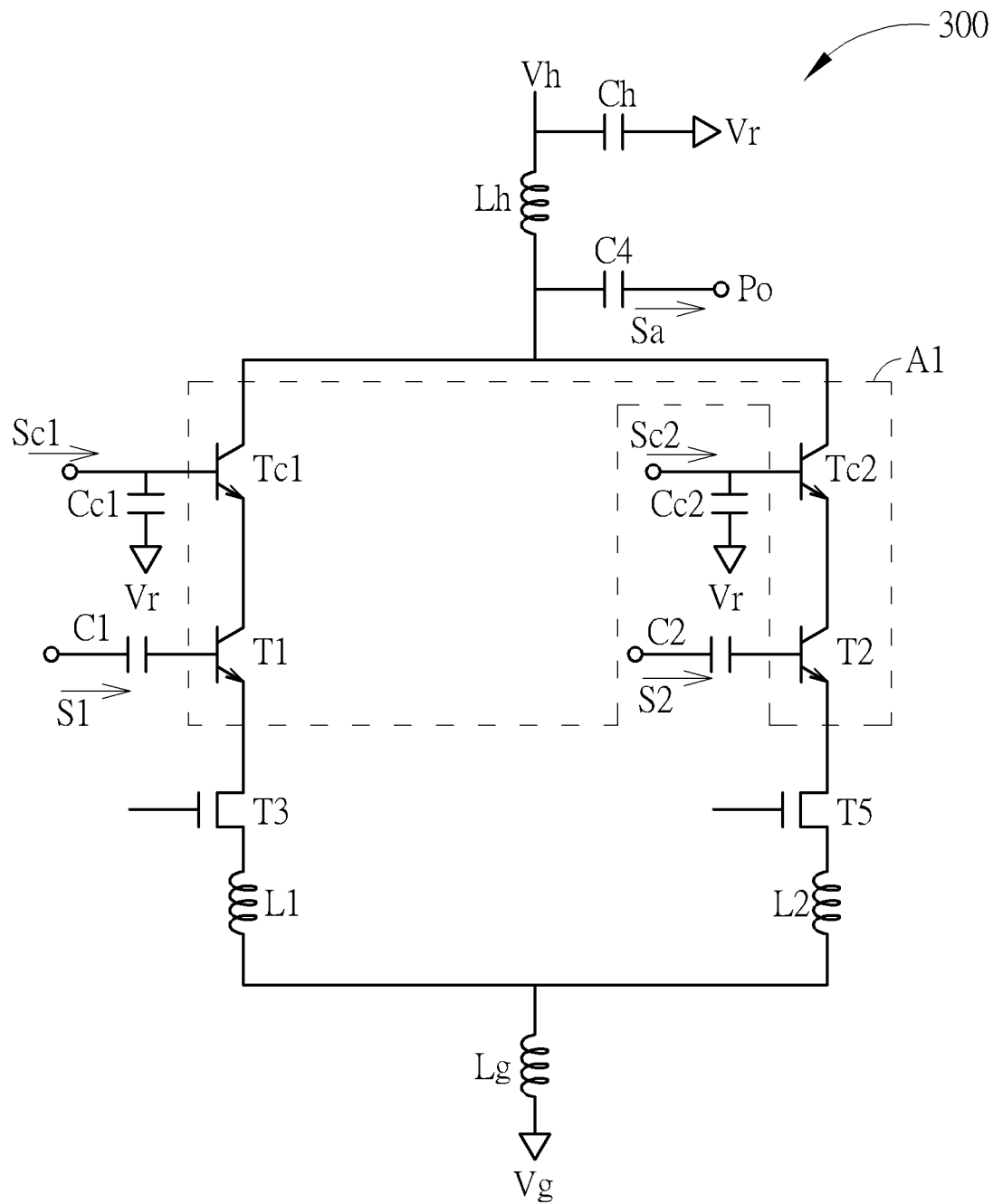
FIG. 3 illustrates an amplifier circuit according to another embodiment.

FIG. 3 illustrates an amplifier circuit 300 according to another embodiment. The amplifier circuit 300 may be similar to the amplifier circuit 200. However, in the amplifier circuit 300, the amplification unit A1 may further include transistors Tc1 and Tc2. The transistor Tc1 may include a first terminal and a second terminal where the first terminal may be coupled to the output terminal Po, and the second terminal may be coupled to the first terminal of the transistor T1. The transistor Tc2 may include a first terminal and a second terminal where the first terminal may be coupled to the output terminal Po, and the second terminal may be coupled to the first terminal of the transistor T2. According to an embodiment, the transistor Tc1 may further include a control terminal for receiving a bias control signal Sc1, and the control terminal may be coupled to the reference voltage terminal Vr through a capacitor Cc1. The bias control signal Sc1 may be used to turn on or turn off the transistor Tc1. The transistor Tc2 may further include a control terminal for receiving a bias control signal Sc2, and the control terminal may be coupled to the reference voltage terminal Vr through a capacitor Cc2. The bias control signal Sc2 may be used to turn on or turn off the transistor Tc2. The bias control signals Sc1 and Sc2 may be DC signals. The capacitors Cc1 and Cc2 may be AC short capacitors where AC signals may be allowed to pass through the capacitors Cc1 and Cc2.

As show in FIG. 3, the transistors Tc1 and T1 may form a cascode structure. Hence, the amplified input signal S1 may be outputted from the first terminal of the transistor Tc1. Likewise, the transistors Tc2 and T2 may form a cascode structure. Hence, the amplified input signal S2 may be outputted from the first terminal of the transistor Tc2. When the amplifier circuit 300 is used to amplify the input signal S1, the transistors T1 and Tc1 and the switch T3 may be turned on, and the transistors T2 and Tc2 and the switch T5 may be turned off. Because there may exist a parasitic capacitor between the first terminal and the control terminal of the turned-off transistor T2, the turned-off transistor Tc2 may make it difficult for the amplified input signal S1 to further leak to the control terminal of the transistor T2 through the parasitic capacitor of the turned-off transistor T2. Hence, it may be reduced that the control terminal of the transistor T1 and the control terminal of the transistor T2 interfere with one another. In other words, the isolation between the first input terminal and the second input terminal of the amplifier circuit 300 may be improved, and the reverse isolation capability of the amplifier circuit 300 may be improved. Likewise, when the amplifier circuit 300 is used to amplify the input signal S2, the transistors T1 and Tc1 and the switch T3 may be turned off, and the transistors T2 and Tc2 and the switch T5 may be turned on. The effects and operation principles of the circuit may be similar to that when the input signal S1 is amplified, so it is not repeatedly described.

Figure 4:
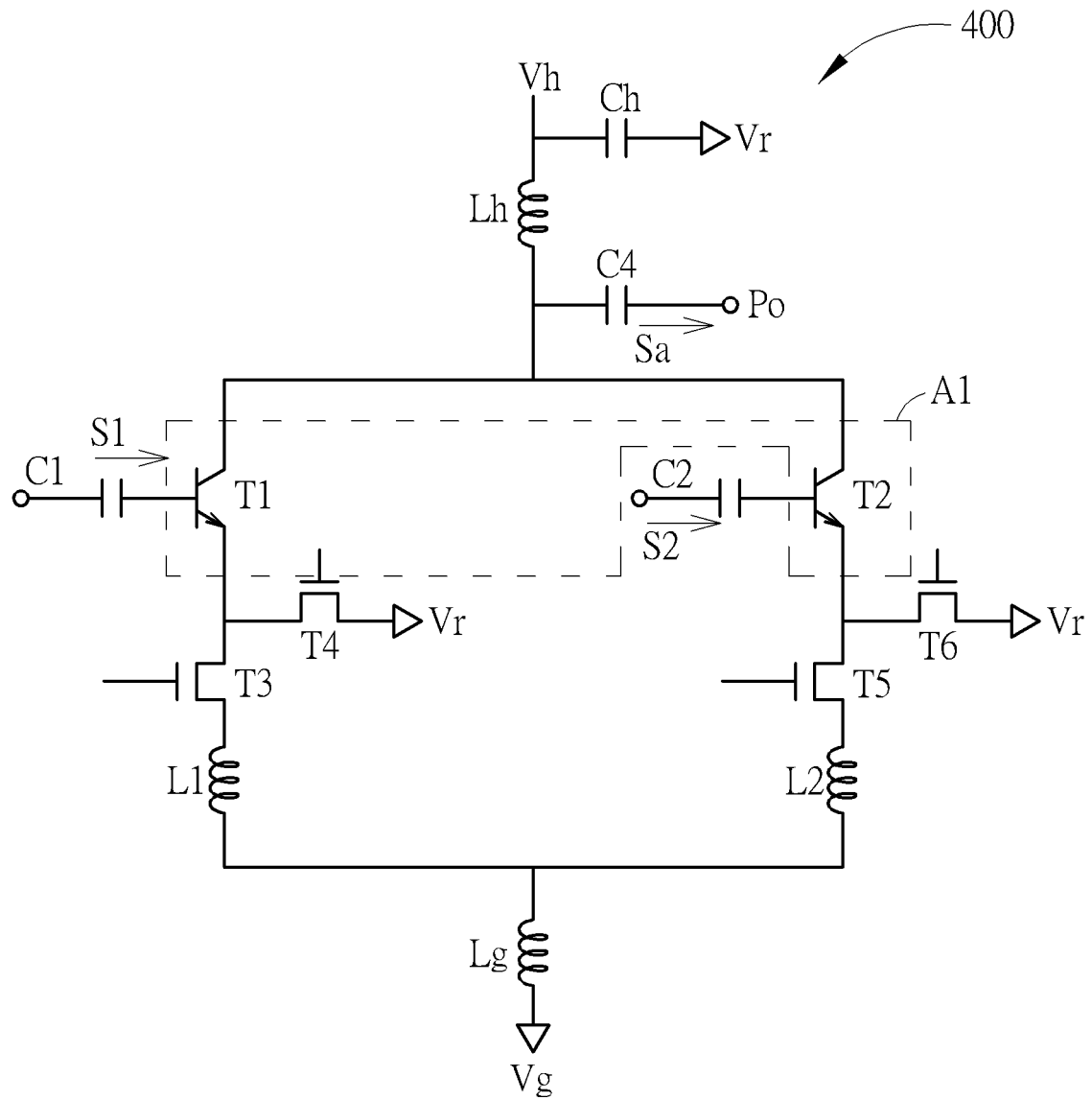
FIG. 4 illustrates an amplifier circuit according to another embodiment.

FIG. 4 illustrates an amplifier circuit 400 according to another embodiment. The amplifier circuit 400 may be similar to the amplifier circuit 200, but the amplifier circuit 400 may further include switches T4 and T6. The switch T4 may include a first terminal and a second terminal where the first terminal may be coupled to the second terminal of the transistor T1, and the second terminal may be coupled to the reference voltage terminal Vr. The switch T6 may include a first terminal and a second terminal where the first terminal may be coupled to the second terminal of the transistor T2, and the second terminal may be coupled to the reference voltage terminal Vr.

In the embodiment of FIG. 4, when the amplifier circuit 400 is used to amplify the input signal S1, the transistor T1 and the switches T3 and T6 may be turned on, and the transistor T2 and the switches T5 and T4 may be turned off. Because there may exist a parasitic capacitor between the first terminal and the second terminal of the turned-off switch T5, when the input signal S1 still leaks toward the transistor T2 through the parasitic capacitor of the turned-off switch T5, the input signal S1 leaking toward the transistor T2 may be shunted to the reference voltage terminal Vr by turning on the switch T6. It may be difficult for the input signal S1 to further leak to the transistor T2. The switch T4 may be turned off when the switch T3 is turned on, and the switch T4 may be turned on when the switch T3 is turned off. In other words, a voltage level of a control terminal of the switch T3 and a voltage level of a control terminal of the switch T4 may be inverted with one another. For example, the voltage level of the control terminal of the switch T3 may be a high level when the voltage level of the control terminal of the switch T4 is a low level, and the voltage level of the control terminal of the switch T3 may be a low level when the voltage level of the control terminal of the switch T4 is a high level. Likewise, when the amplifier circuit 400 is used to amplify the input signal S2, the transistor T1 and the switches T3 and T6 may be turned off, and the transistor T2 and the switches T5 and T4 may be turned on. The effects and operation principles of the circuit may be similar to that when the input signal S1 is amplified, so it is not repeatedly described.

Figure 5:
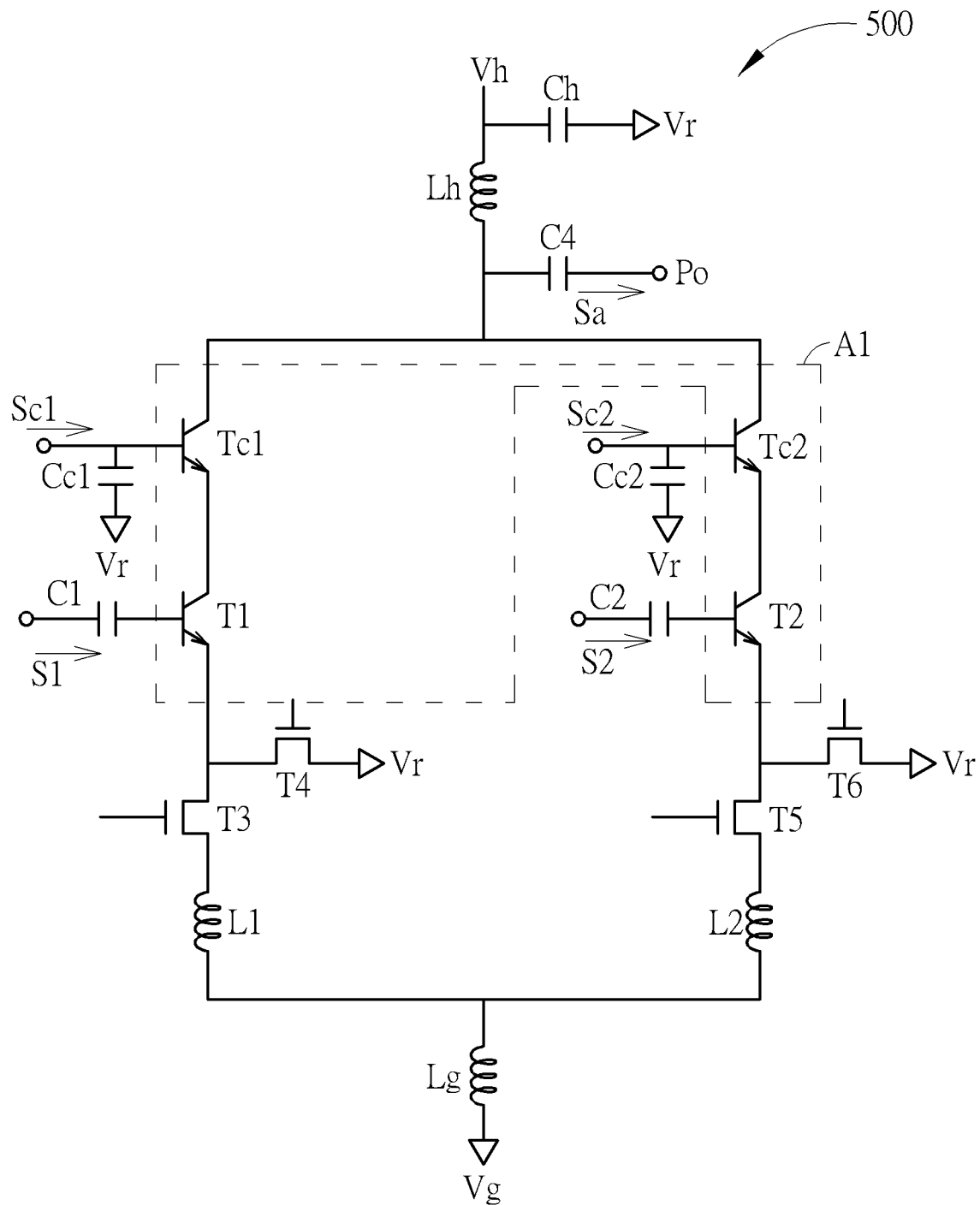
FIG. 5 illustrates an amplifier circuit according to another embodiment.

FIG. 5 illustrates an amplifier circuit 500 according to another embodiment. The amplifier circuit 500 may be similar to the amplifier circuit 400. However, in the amplifier circuit 500, the amplification unit A1 may further include transistors Tc1 and Tc2. The transistors Tc1 and T1 may form a cascode structure. The transistors Tc2 and T2 may form a cascode structure. The couplings, effects and operation principles related to the transistors Tc1 and Tc2 may be similar to that of FIG. 3, so it is not repeatedly described.

Figure 6:
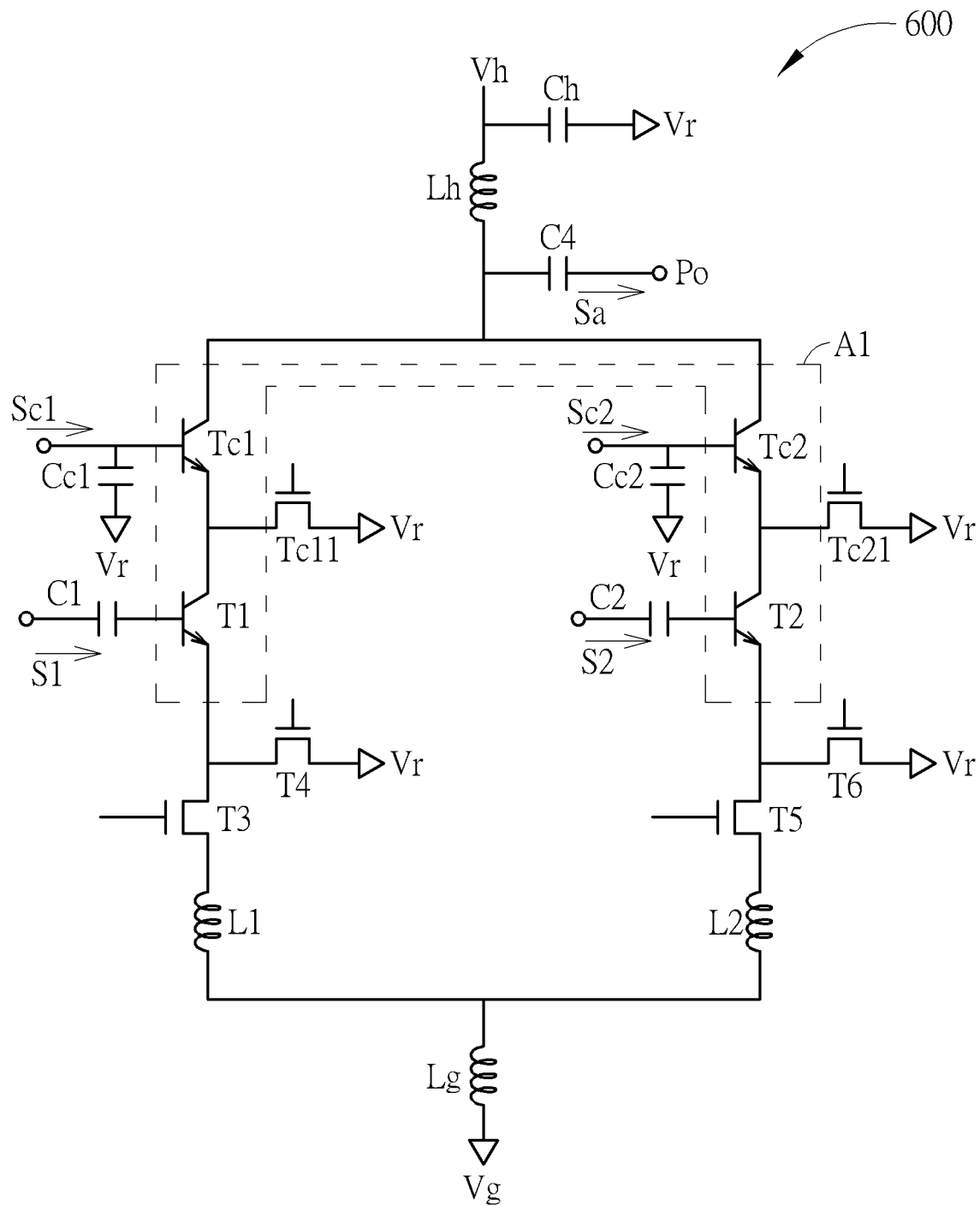
FIG. 6 illustrates an amplifier circuit according to another embodiment.

FIG. 6 illustrates an amplifier circuit 600 according to another embodiment. The amplifier circuit 600 may be similar to the amplifier circuit 500, but the amplifier circuit 600 may further include switches Tc11 and Tc21. The switch Tc11 may include a first terminal and a second terminal where the first terminal may be coupled to the first terminal of the transistor T1, and the second terminal may be coupled to the reference voltage terminal Vr. The switch Tc21 may include a first terminal and a second terminal where the first terminal may be coupled to the first terminal of the transistor T2, and the second terminal may be coupled to the reference voltage terminal Vr. When the amplifier circuit 600 is used to amplify the input signal S1, the transistors T1 and Tc1 and the switches T3, T6 and Tc21 may be turned on, and the transistors T2 and Tc2 and the switches T5, T4 and Tc11 may be turned off.

Because there may exist a parasitic capacitor between the first terminal and the second terminal of each of the turned-off transistors T2 and Tc2, when the input signal S1 is too strong and further leaks toward the transistor Tc2 through the parasitic capacitor of the turned-off transistor T2, the input signal S1 leaking toward the transistor Tc2 may be shunted to the reference voltage terminal Vr by turning on the switch Tc21. Hence, it may be difficult for the input signal S1 to further leak to the output terminal Po through the parasitic capacitor of the turned-off transistor Tc2, and the interference with the output terminal Po may be reduced where the interference is caused by the input signal S1 leaking through the parasitic capacitor of the turned-off transistor Tc2. In other words, the influence caused by unused paths of the amplifier circuit 600 upon the output terminal Po may be reduced. Furthermore, by means of shunting the input signal S1 to the reference voltage terminal Vr by turning on the switch Tc21, unwanted conduction caused by the input signal S1 changing a voltage between the control terminal and the second terminal of the transistor Tc2 may be reduced, and the influence upon performance of the amplifier circuit 600 may be reduced. The switches T4 and Tc11 may be turned off when the switch T3 is turned on, and the switches T4 and Tc11 may be turned on when the switch T3 is turned off. In other words, a voltage level of the control terminal of the switch T3 may be inverted with voltage levels of the control terminals of the switches T4 and Tc11 according to an embodiment. Likewise, when the amplifier circuit 600 is used to amplify the input signal S2, the transistors T1 and Tc1 and the switches T3, T6 and Tc21 may be turned off, and the transistors T2 and Tc2 and the switches T5, T4 and Tc11 may be turned on. The related effects and operation principles may be similar to that when amplifying the input signal S1, so it is not repeatedly described.

As shown in FIG. 1 to FIG. 6, the amplifier circuits 100 to 600 may be used to process the input signals S1 and S2. However, the disclosure is not limited hereto. According to another embodiment of the disclosure, an amplifier circuit may process more input signals by expanding the circuit as needed.

Figure 7:
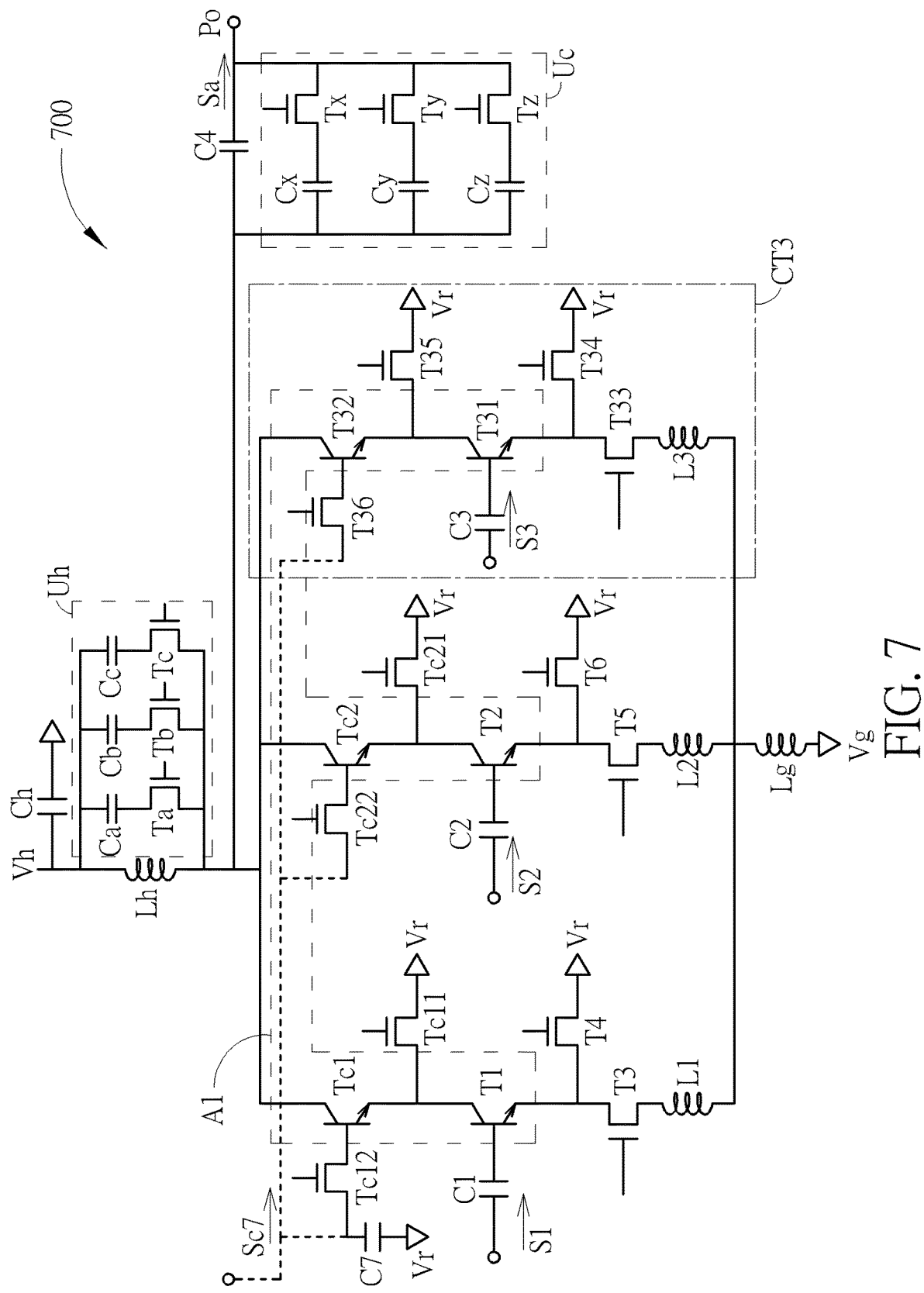
FIG. 7 illustrates an amplifier circuit according to another embodiment.

FIG. 7 illustrates an amplifier circuit 700 according to another embodiment. The amplifier circuit 700 may be similar to the amplifier circuit 600, but the amplifier circuit 700 may further include a circuit CT3. The circuit CT3 may include transistors T31 and T32. The transistor T31 may include a control terminal, a first terminal and a second terminal where the control terminal may be a third input terminal of the amplifier circuit 700 for receiving an input signal S3. The transistor T32 may include a control terminal, a first terminal and a second terminal where the first terminal may be coupled to the output terminal Po, and the second terminal may be coupled to the first terminal of the transistor T31. The transistors T31 and T32 may form a cascode structure, so the first terminal of the transistor T32 may be used to output an amplified input signal S3. In other words, in FIG. 7, the amplification unit A1 may further include the transistors T31 and T32. Furthermore, the circuit CT3 may optionally further include a capacitor C3, an inductor L3, switches T33, T34 and T35. The couplings, effects and operation principles of the circuit related to the capacitor C3, the inductor L3, the switches T33, T34 and T35 may be similar to that of the capacitor C1, the inductor L1 and the switches T3, T4 and Tc11 of FIG. 6 or be similar to that of the capacitor C2, the inductor L2 and the switches T5, T6 and Tc21 of FIG. 6, so it is not repeatedly described.

In FIG. 6, the control terminals of the transistors Tc1 and Tc2 may be coupled to the reference voltage terminal Vr through the capacitors Cc1 and Cc2 respectively. However, in FIG. 7, the amplifier circuit 700 may further include switches Tc12, Tc22 and T36 and a capacitor C7. Each of the switches Tc12, Tc22 and T36 may have a first terminal and a second terminal. The first terminals of the switches Tc12, Tc22 and T36 may be respectively coupled to the control terminals of the corresponding transistors Tc1, Tc2 and T32. The second terminals of the switches Tc12, Tc22 and T36 may all be coupled to a first terminal of the capacitor C7, and a second terminal of the capacitor C7 may be coupled to the reference voltage terminal Vr. For the switches Tc12, Tc22 and T36, the capacitor C7 may be a shared AC short capacitor. By sharing the capacitor C7, the size of the circuit may be reduced.

Furthermore, the second terminals of the switches Tc12, Tc22 and T36 may further be used to receive a bias control signal Sc7. By turning on or turning off the switches Tc12, Tc22 and T36, the bias control signal Sc7 may be sent or not sent to the control terminals of the corresponding transistors Tc1, Tc2 and T32, and the transistors Tc1, Tc2 and T32 may be turned on or off accordingly. The bias control signal Sc7 may be a DC signal. For example, when the amplifier circuit 700 is used to amplify the input signal S1, the transistors T1 and Tc1 and the switches T3, T6, Tc21, T34, T35 and Tc12 may be turned on, and the transistors T2, Tc2, T31 and T32 and the switches T5, T33, T4, Tc11, Tc22 and T36 may be turned off. When the amplifier circuit 700 is used to amplify the input signal S2, the transistors T1, Tc1, T31 and T32 and the switches T3, T33, T6, Tc21, Tc12 and T36 may be turned off, and the transistors T2 and Tc2 and the switches T5, T4, Tc11, T34, T35 and Tc22 may be turned on. When the amplifier circuit 700 is used to amplify the input signal S3, the transistor T1, Tc1, T2 and Tc2 and the switches T3, T5, T34, T35, Tc12 and Tc22 may be turned off, and the transistors T31 and T32 and the switches T33, T4, Tc11, T6, Tc21 and T36 may be turned on.

As shown in FIG. 7, the amplifier circuit 700 may optionally further include an inductance adjustment unit Uh and a capacitance adjustment unit Uc. The inductance adjustment unit Uh may be in parallel with the inductor Lh. The inductance adjustment unit Uh may include switches Ta, Tb and Tc and capacitors Ca, Cb and Cc. By turning on or turning off the switches Ta, Tb and/or Tc, the loading between the two terminals of the inductor Lh may be adjusted. Likewise, the capacitance adjustment unit Uc may be in parallel with the capacitor C4. The capacitance adjustment unit Uc may include switches Tx, Ty and Tz and capacitors Cx, Cy and Cz. By turning on or turning off the switches Tx, Ty and/or Tz, the loading between the two terminals of the capacitor C4 may be adjusted. In FIG. 7, the number of the switches and the number of the capacitors in the inductance adjustment unit Uh and the capacitance adjustment unit Uc may merely be an example, and a user may increase or decrease the number according to required accuracy or loading range.

Figure 8:
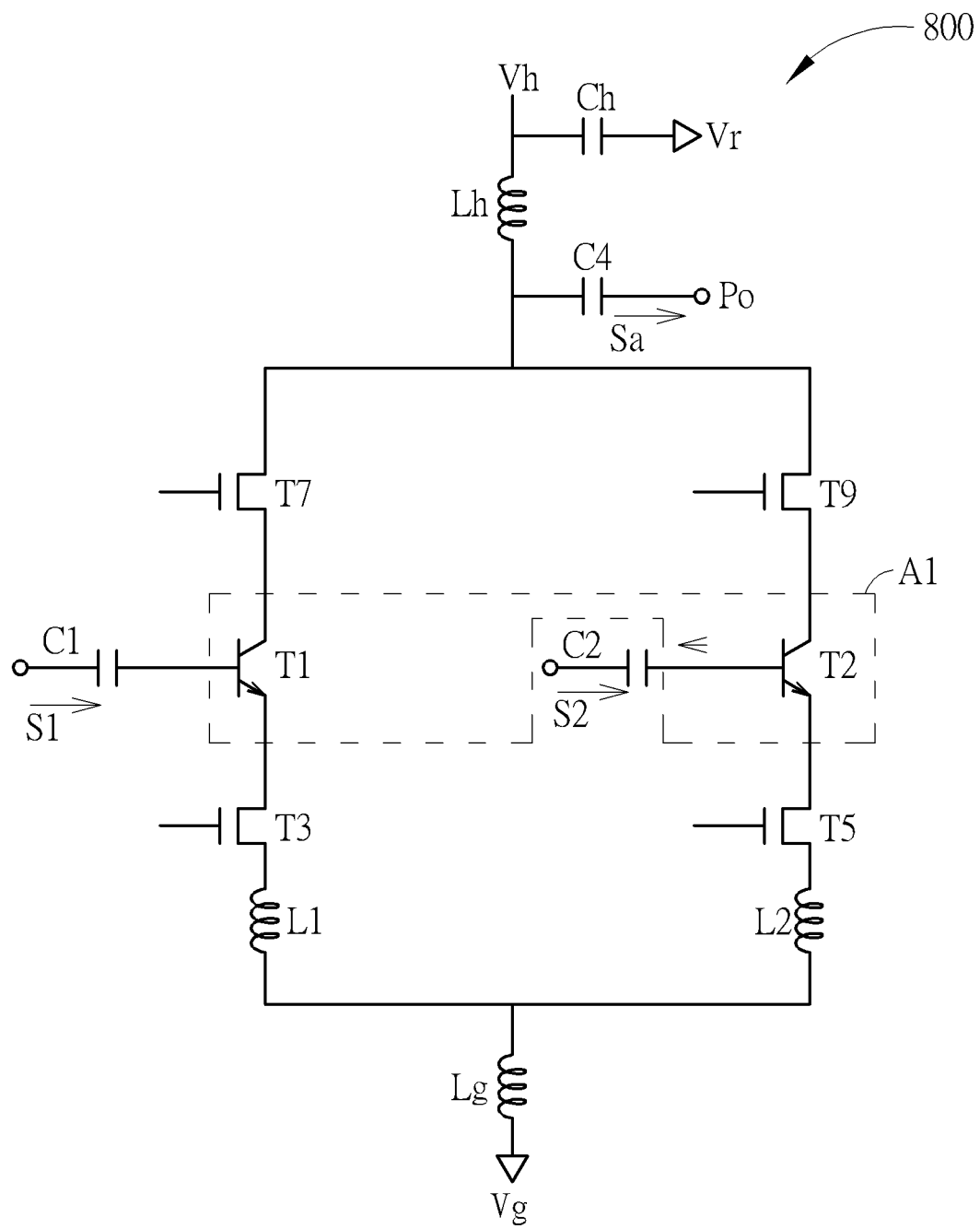
FIG. 8 illustrates an amplifier circuit according to another embodiment.

FIG. 8 illustrates an amplifier circuit 800 according to another embodiment. The amplifier circuit 800 may be similar to the amplifier circuit 200 of FIG. 2. However, the amplifier circuit 800 may optionally further include switches T7 and T9 as compared with the amplifier circuit 200. The switch T7 may include a first terminal and a second terminal where the first terminal may be coupled to the output terminal Po, and the second terminal may be coupled to the first terminal of the transistor T1. The switch T9 may include a first terminal and a second terminal where the first terminal may be coupled to the output terminal Po, and the second terminal may be coupled to the first terminal of the transistor T2.

In FIG. 8, when the amplifier circuit 800 is used to amplify the input signal S1, the transistor T1 and the switches T3 and T7 may be turned on, and the transistor T2 and the switches T5 and T9 may be turned off. Because there may exist a parasitic capacitor between the first terminal and the second terminal of each of the turned-off transistor T2 and switch T5, when the input signal S1 still leaks to the transistor T2 through the parasitic capacitor of the turned-off switch T5, the turned-off switch T9 may make it difficult for the input signal S1 to further leak to the output terminal Po through the parasitic capacitor of the turned-off transistor T2. Hence, the interference with the output terminal Po may be reduced where the interference is caused by the input signal S1 leaking through the parasitic capacitor of the turned-off transistor T2. In other words, the influence caused by unused paths of the amplifier circuit 800 upon the output terminal Po may be reduced. Furthermore, because there may further exist another parasitic capacitor between the first terminal and the control terminal of the turned-off transistor T2, the turned-off switch T9 may make it difficult for the amplified input signal S1 to further leak to the control terminal of the transistor T2 through the parasitic capacitor of the turned-off transistor T2. Hence, it may be reduced that the control terminal of the transistor T1 and the control terminal of the transistor T2 interfere with one another. In other words, the isolation between the first input terminal and the second input terminal of the amplifier circuit 800 may be improved, and the reverse isolation capability of the amplifier circuit 800 may be improved. Likewise, when the amplifier circuit 800 is used to amplify the input signal S2, the transistor T2 and the switches T5 and T9 may be turned on, and the transistor T1 and the switches T3 and T7 may be turned off. The effects and operation principles of the circuit may be similar to that when amplifying the input signal S1, so it is not repeatedly described.

Figure 9:
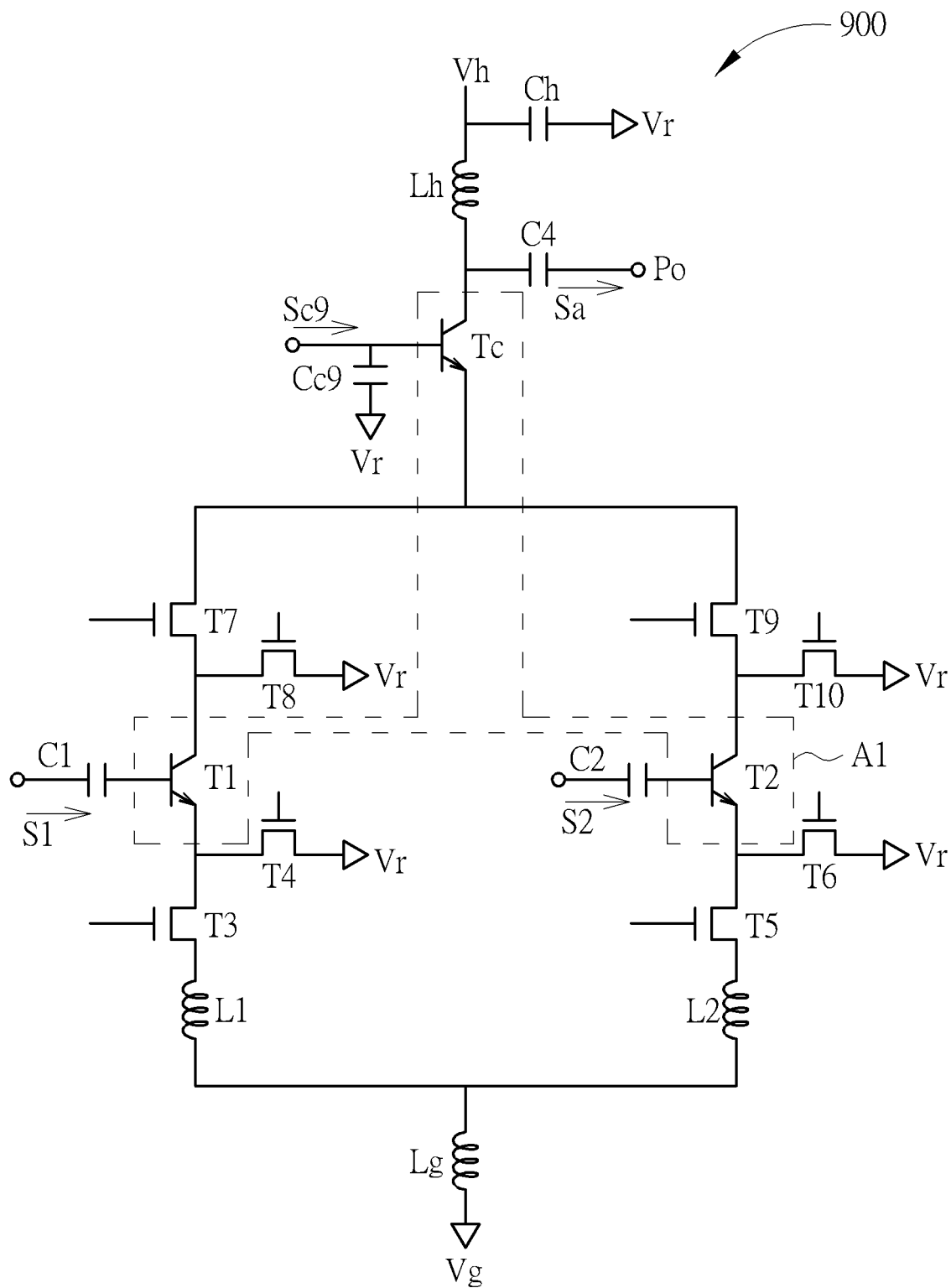
FIG. 9 illustrates an amplifier circuit according to another embodiment.

FIG. 9 illustrates an amplifier circuit 900 according to another embodiment. The amplifier circuit 900 may be similar to the amplifier circuit 800. However, the amplifier circuit 900 may optionally further include not only the switches T4 and T6 shown in FIG. 4 but also switches T8 and T10 shown in FIG. 9. Furthermore, the amplification unit A1 of the amplifier circuit 900 may optionally further include a transistor Tc. The switch T8 may include a first terminal and a second terminal where the first terminal may be coupled to the first terminal of the transistor T1 and the second terminal may be coupled to the reference voltage terminal Vr. The switch T10 may include a first terminal and a second terminal where the first terminal may be coupled to the first terminal of the transistor T2 and the second terminal may be coupled to the reference voltage terminal Vr. The transistor Tc may include a first terminal and a second terminal where the first terminal may be coupled to the output terminal Po and the second terminal may be coupled to the first terminal of the switch T7 and the first terminal of the switch T9. The transistor Tc may further include a control terminal to receive a bias control signal Sc9 and be coupled to the reference voltage terminal Vr through a capacitor Cc9. The bias control signal Sc9 may be a DC signal for turning on or turning off the transistor Tc. The capacitor Cc9 may be an AC short capacitor. According to other embodiments, the amplification unit A1 of each of the amplifier circuits 100 to 800 may optionally further include the transistor Tc.

In the embodiment of FIG. 9, when the amplifier circuit 900 is used to amplify the input signal S1, the transistors T1 and Tc and the switches T3, T7, T6 and T10 may be turned on, and the transistor T2 and the switches T5, T9, T4 and T8 may be turned off. In this condition, the transistors Tc and T1 may form a cascode structure. Hence, the amplified input signal S1 may be outputted from the first terminal of the transistor Tc. Because there may exist a parasitic capacitor between the first terminal and the second terminal of each of the turned-off transistor T2 and switch T5, when the input signal S1 still leaks toward the transistor T2 through the parasitic capacitor of the turned-off switch T5, the input signal S1 leaking toward the transistor T2 may be shunted to the reference voltage terminal Vr by turning on the switch T6. Unwanted conduction caused by the input signal S1 changing a voltage between the control terminal and the second terminal of the transistor T2 may be reduced, and it may be reduced that the control terminal of the transistor T1 and the control terminal of the transistor T2 interfere with one another. In other words, the isolation between the first input terminal and the second input terminal of the amplifier circuit 900 may be improved. When the input signal S1 is too strong and further leaks toward the transistor Tc through the parasitic capacitor of the turned-off transistor T2, by turning on the switch T10, the input signal S1 leaking toward the transistor Tc may be further shunted to the reference voltage terminal Vr, the intensity of the input signal S1 may be greatly attenuated. It may be more difficult for the input signal S1 to leak to the transistor Tc, and the performance of the amplifier circuit 900 may be less affected. Moreover, when the input signal S1 is too strong and still leaks toward the transistor Tc through the parasitic capacitor of the turned-off transistor T2, by turning off the switch T9, it may be more difficult for the input signal S1 to further leak to the transistor Tc, and the performance of the amplifier circuit 900 may be less affected. Furthermore, because there may further exist another parasitic capacitor between the first terminal and the control terminal of the turned-off transistor T2, the turned-off switch T9 may make it difficult for the amplified input signal S1 to further leak to the control terminal of the transistor T2 through the turned-on transistor Tc and the parasitic capacitor of the turned-off transistor T2. Considering that a parasitic capacitor exists between the first terminal and the second terminal of the turned-off switch T9, in order to better reduce that the amplified input signal S1 leaks toward the control terminal of the transistor T2 through the turned-on transistor Tc and the parasitic capacitor of the turned-off switch T9, the amplified input signal S1 leaking toward the control terminal of the transistor T2 may be shunted to the reference voltage terminal Vr by turning on the switch T10, and it may be more difficult for the amplified input signal S1 to further leak to the control terminal of the transistor T2. It may be reduced for the control terminal of the transistor T1 and the control terminal of the transistor T2 to interfere with one another. In other words, the isolation between the first input terminal and the second input terminal of the amplifier circuit 900 may be improved, and the reverse isolation capability of the amplifier circuit 900 may be improved. When the switch T3 is turned on, the switches T4 and T8 may be turned off, and when the switch T3 is turned off, the switches T4 and T8 may be turned on. In other words, a voltage level of the control terminal of the switch T3 may be inverted with voltage levels of the control terminals of the switches T4 and T8 according to an embodiment. Likewise, when the amplifier circuit 900 is used to amplify the input signal S2, the transistors T2 and Tc and the switches T5, T9, T4 and T8 may be turned on, and the transistor T1 and the switches T3, T7, T6 and T10 may be turned off. In this condition, the transistors Tc and T2 may form a cascode structure. Hence, the amplified input signal S2 may be outputted from the first terminal of the transistor Tc. The effects and operation principles of the circuit may be similar to that when the input signal S1 is amplified, so it is not repeatedly described. In the embodiment of FIG. 9, by sharing the transistor Tc, the size of the circuit may be reduced.

Figure 10:
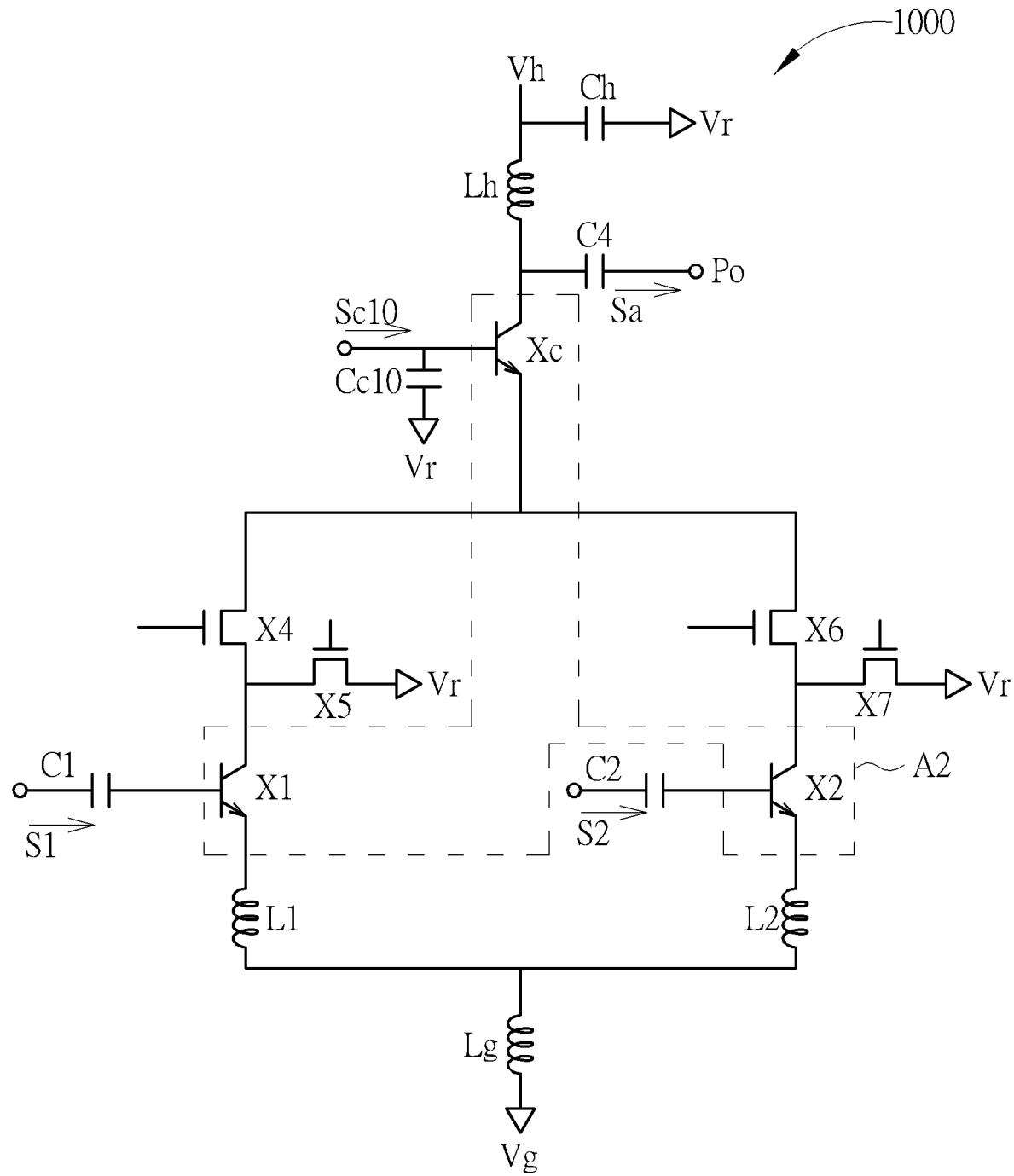
FIG. 10 illustrates an amplifier circuit according to another embodiment.

FIG. 10 illustrates an amplifier circuit 1000 according to another embodiment. The amplifier circuit 1000 may include an amplification unit A2. The amplification unit A2 may include transistors X1, X2 and Xc. The transistor X1 may include a control terminal, a first terminal and a second terminal where the control terminal may be used as a first input terminal of the amplifier circuit 1000 for receiving an input signal S1, and the first terminal may be coupled to an output terminal Po for outputting an amplified input signal S1. The transistor X2 may include a control terminal, a first terminal and a second terminal where the control terminal may be used as a second input terminal of the amplifier circuit 1000 for receiving an input signal S2, and the first terminal may be coupled to the output terminal Po for outputting an amplified input signal S2. The transistor Xc may be coupled between the output terminal Po and the transistor X1 and be coupled between the output terminal Po and the transistor X2. Further, the transistor Xc may include a first terminal and a second terminal where the first terminal may be coupled to the output terminal Po. The transistor Xc may further include a control terminal used to receive a bias control signal Sc10 and coupled to the reference voltage terminal Vr through a capacitor Cc10. The bias control signal Sc10 may be a DC signal for turning on or turning off the transistor Xc. The capacitor Cc10 may be an AC short capacitor. The output terminal Po may be used to output an amplification signal Sa, and the amplification signal Sa may be generated using at least the amplified input signal S1 and/or the amplified input signal S2.

As shown in FIG. 10, the amplifier circuit 1000 may optionally further include switches X4 and X6. The switch X4 may include a first terminal and a second terminal where the first terminal may be coupled to the second terminal of the transistor Xc, and the second terminal may be coupled to the first terminal of the transistor X1. The transistor X6 may include a first terminal and a second terminal where the first terminal may be coupled to the second terminal of the transistor Xc and the second terminal may be coupled to the first terminal of the transistor X2.

As shown in FIG. 10, the amplifier circuit 1000 may optionally further include switches X5 and X7. The switch X5 may include a first terminal and a second terminal where the first terminal may be coupled to the first terminal of the transistor X1, and the second terminal may be coupled to the reference voltage terminal Vr. The transistor X7 may include a first terminal and a second terminal where the first terminal may be coupled to the first terminal of the transistor X2 and the second terminal may be coupled to the reference voltage terminal Vr.

In the embodiment of FIG. 10, when the amplifier circuit 1000 is used to amplify the input signal S1, the transistors X1 and Xc and the switches X4 and X7 may be turned on, and the transistor X2 and the switches X6 and X5 may be turned off. In this condition, the transistors Xc and X1 may form a cascode structure. Hence, the amplified input signal S1 may be outputted from the first terminal of the transistor Xc. Because the second terminal of the transistor X1 and the second terminal of the transistor X2 may form a common structure, and there may exist a parasitic capacitor between the first terminal and the second terminal of the turned-off transistor X2, when the input signal S1 leaks toward the transistor Xc through the parasitic capacitor of the turned-off transistor X2, by turning on the switch X7, the input signal S1 leaking toward the transistor Xc may be shunted to the reference voltage terminal Vr. The intensity of the input signal S1 may be attenuated to make it difficult for the input signal S1 to leak to the transistor Xc. When the input signal S1 still leaks toward the transistor Xc through the parasitic capacitor of the turned-off transistor X2, the turned-off switch X6 may further raise the difficulty for the input signal S1 to leak to the transistor Xc so that the performance of the amplifier circuit 1000 may be less affected. Furthermore, because there may exist another parasitic capacitor between the first terminal and the control terminal of the turned-off transistor X2, the turned-off switch X6 may make it difficult for the amplified input signal S1 to leak to the control terminal of the transistor X2 through the turned-on transistor Xc and the parasitic capacitor of the turned-off transistor X2. Considering that a parasitic capacitor exists between the first terminal and the second terminal of the turned-off switch X6, in order to better reduce that the amplified input signal S1 leaks toward the control terminal of the transistor X2 through the turned-on transistor Xc and the parasitic capacitor of the turned-off switch X6, the amplified input signal S1 leaking toward the control terminal of the transistor X2 may be shunted to the reference voltage terminal Vr by turning on the switch X7, and it may be more difficult for the amplified input signal S1 to further leak to the control terminal of the transistor X2. Hence, the interference between the control terminal of the transistor X1 and the control terminal of the transistor X2 is reduced. In other words, the isolation between the first input terminal and the second input terminal of the amplifier circuit 1000 is improved, and the reverse isolation capability is improved. When the switch X4 is turned on, the switch X5 may be turned off, and when the switch X4 is turned off, the switch X5 may be turned on. In other words, a voltage level of the control terminal of the switch X4 may be inverted with a voltage level of the control terminal of the switch X5 according to an embodiment. Likewise, when the amplifier circuit 1000 is used to amplify the input signal S2, the transistor X1 and the switches X4 and X7 may be turned off, and the transistors X2 and Xc and the switches X6 and X5 may be turned on. In this condition, the transistors Xc and X2 may form a cascode structure.

Hence, the amplified input signal S2 may be outputted from the first terminal of the transistor Xc. The effects and operation principles of the circuit may be similar to that when amplifying the input signal S1, so it is not repeatedly described. In the embodiment of FIG. 10, by sharing the transistor Xc, the size of the circuit is reduced.

As in FIG. 2 to FIG. 9, the amplifier circuit 1000 may further include the inductors Lh and Lg and the capacitor Ch, and may optionally further include the capacitors C1, C2 and C4 and the inductors L1 and L2. The effects and operation principles of the circuit may be similar to that in FIG. 2 to FIG. 9, so it is not repeatedly described.

Each of the foresaid transistors may be (but not limited to) a bipolar junction transistor (BJT) or a metal-oxide-semiconductor field-effect transistor (MOSFET). When a transistor is a BJT, a first terminal of the transistor may be one of a collector terminal and an emitter terminal, a second terminal may be another one of the collector terminal and the emitter terminal, and a control terminal may be a base terminal. When a transistor is a MOSFET, a first terminal of the transistor may be one of a drain terminal and a source terminal, a second terminal may be another one of the drain terminal and the source terminal, and a control terminal may be a gate terminal. Each of the foresaid switches may be a transistor switch or an appropriate controllable switch element which can be turned on and turned off. A switch may be controlled to be turned on or turned off by means of logic signals. For example, when a logic signal is of a high level (e.g. 1), the logic signal may be used to turn on a switch; and when a logic signal is of a low level (e.g. 0), the logic signal may be used to turn off a switch. The number of the input signals shown in each of FIG. 1 to FIG. 10 may be merely an example. According to embodiments, the number of input signals can be increased by expanding the circuit using more circuit components. For example, the circuit may be expanded as shown in FIG. 7.

In summary, the amplifier circuit provided by the embodiment may be used for processing multiple input signals such as the input signals S1, S2 and/or S3 shown in FIG. 1 to FIG. 10, so the amplifier circuit may support various operation modes. For example, when the amplifier circuit is used in a communication field, the amplifier circuit may be a low noise amplifier (LNA), the first signal S1 may be a signal of a first frequency band, the input signal S2 may be a signal of a second frequency band, and the input signal S3 may be a signal of a third frequency band. The first frequency band, the second frequency band and the third frequency band may be of different frequency bands. Hence, frequency bands of different input signals may be different, and the amplifier circuit may support amplification of signals of various frequency bands.

Furthermore, the isolation between a path in use and an unused path may be effectively improved by turning on and turning off switches in an amplifier circuit provided by an embodiment. For example, when the amplifier circuit is used to amplify a first input signal using a path (i.e. a path in use) instead of amplifying a second input signal using another path (i.e. an unused path), by turning on or turning off switches mentioned above, the first input signal may be reduced from leaking to the path used for amplifying the second input signal. The influence cause by an unused path upon an output terminal may hence be reduced. The isolation between an input terminal for receiving the first input signal and another input terminal for receiving the second input signal may be improved. The reverse isolation capability of the amplifier circuit may be improved. Hence, it is beneficial for suppressing return loss, suppressing noise figure, widening output frequency bands and reducing unwanted interference, and so on.

Figure 11:
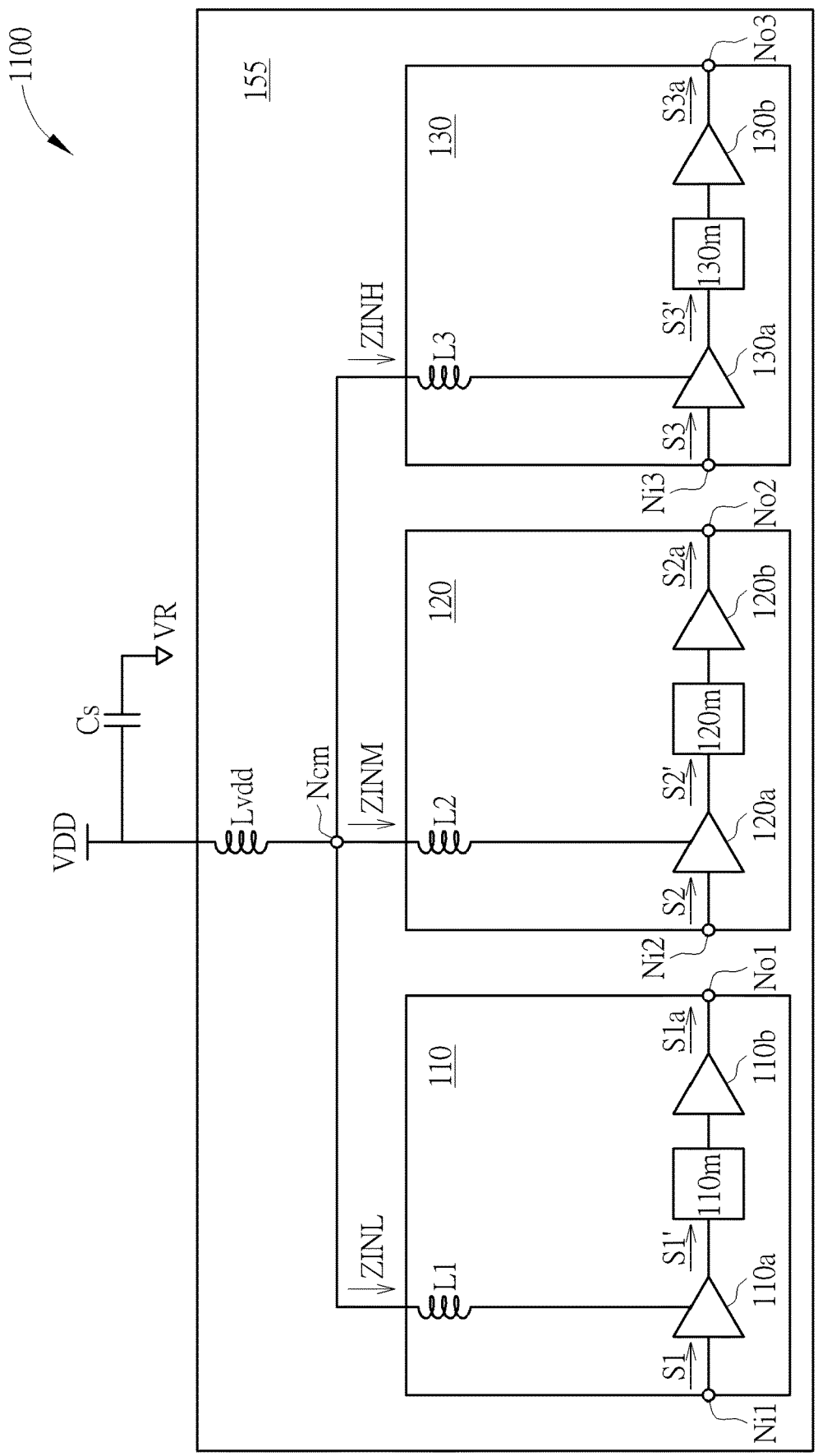
FIG. 11 illustrates an amplifier circuit according to another embodiment.

FIG. 11 illustrates an amplifier circuit 1100 according to an embodiment. The amplifier circuit 1100 includes power amplifiers 110, 120 and 130. For example, the power amplifier 110 can be used for amplifying signals of a low frequency band (a.k.a. low band). The power amplifier 120 can be used for amplifying signals of a middle frequency band (a.k.a. middle band). The power amplifier 130 can be used for amplifying signals of a high frequency band (a.k.a. high band).

For example, the low band can be between 699 MHz to 915 MHz, the middle band can be between 1.7 GHz to 1.98 GHz, and the high band can be between 2.3 GHz to 2.7 GHz; however, embodiments are not limited thereto.

As shown in FIG. 11, the power amplifier 110 can include an inductor L1, an input terminal Ni1, a first amplification stage 110a, a matching circuit 110m, a second amplification stage 110b and an output terminal No1. The input terminal Ni1 can receive an input signal S1. A power amplifier can be referred to as an amplifier in the text. An amplification stage can be referred to as a stage in the text. The first amplification stage 110a can receive and amplify the input signal S1 to generate the amplified input signal S1', and the second amplification stage 110b can receive and amplify the amplified input signal S1' to generate an amplification signal S1a. The output terminal No1 can output the amplification signal S1a.

The matching circuit 120m can be formed using passive components (e.g., resistors, capacitors and inductors) and be coupled between the amplification stage 110a and the amplification stage 110b.

Likewise, in the power amplifier 120, the input terminal Ni2 can receive a second input signal S2. The amplification stage 120a can receive and amplify the input signal S2 to generate the amplified input signal S2'. The stage 120b can receive and amplify the amplified input signal S2' to generate the amplification signal S2a. The output terminal No2 can output the amplification signal S2a. Likewise, in the power amplifier 130, the input terminal Ni3 can receive a third input signal S3. The amplification stage 130a can receive and amplify the input signal S3 to generate the amplified input signal S3'. The amplification stage 130b can receive and amplify the amplified input signal S3' to generate the amplification signal S3a. The output terminal No3 can output the amplification signal S3a.

As shown in FIG. 11, the amplifiers 110 to 130 can be disposed on a circuit board 155. For example, the circuit board 155 can be a bismaleimide-triazine (BT) board, but embodiments are not limited thereto.

As shown in FIG. 11, the amplifiers 110, 120 and 130 can be coupled to a reference voltage terminal VDD through an inductor Lvdd. A capacitor Cs can be coupled between the reference voltage terminal VDD and another reference voltage terminal VR. In the text, the reference voltage terminal VDD can provide the reference voltage VDD, and the reference voltage terminal VR can provide the reference voltage VR. For example, the reference voltage terminal VDD can provide a predetermined high voltage, and the reference voltage terminal VR can provide a predetermined low voltage or a ground voltage. The capacitor Cs can be a shunt capacitor. Ideally, the inductors Lvdd, L1, L2 and L3 in FIG. 11 can provide zero impedance for direct-current (DC) signals and increase the impedance on increasing of the frequency of alternating-current (AC) signals. In FIG. 11, the impedance ZINL can be the impedance observed by looking toward the amplifier 110 from the common node Ncm. The impedance ZINM can be the impedance observed by looking toward the amplifier 120 from the common node Ncm. The impedance ZINH can be the impedance observed by looking toward the amplifier 130 from the common node Ncm. As shown in FIG. 11, the amplifiers 110, 120 and 130 can be coupled to the reference voltage terminal VDD through the common node Ncm.

As shown in FIG. 11, the amplifier circuit 1100 can receive a plurality of input signals (e.g., S1, S2 and S3) to respectively generate the amplification signals (e.g., S1a, S2a and S3a). However, the amplifiers in the amplifier circuit 1100 cannot be in use concurrently. For example, when the one of the amplifiers 110, 120 and 130 are in use to amplifier a signal of a related (frequency) band, the other two amplifiers are turned off to be unused. In the example of FIG. 11, the amplifier circuit 1100 can be operated in three band, and in each band only one amplifier is turned. Besides, the amplifier circuit 1100 can be operated in multiple modes, where different modes can correspond to different communication systems. For example, the communication systems corresponding to different modes can include WCDMA (Wideband Code Division Multiple Access), LTE (Long Term Evolution), and so on. Hence, the amplifier circuit 1100 can be a multi-mode multi-band power amplifier module. FIG. 11 is merely an example, if an amplifier circuit include n amplifiers, the amplifier circuit can be operated in n modes for processing signals of n bands, where n is a positive integer larger than one.

For example, when the amplifier 130 is in use for amplifying the signal S3 of the high band, the amplifiers 110 and 120 should be turned off. In this scenario, ideally, the impedance ZINH should be much smaller than the impedances ZINL and ZINM. However, because the capacitor Cs may not be an ideal AC short capacitor for AC signals of different frequencies, and there are conductive paths related to the inductor Lvdd, loading effect may occur among the amplifiers 110, 120 and 130, and the impedance ZINH may not be much smaller than the impedances ZINL and ZINM when the amplifier 130 is in use.

Figure 12:
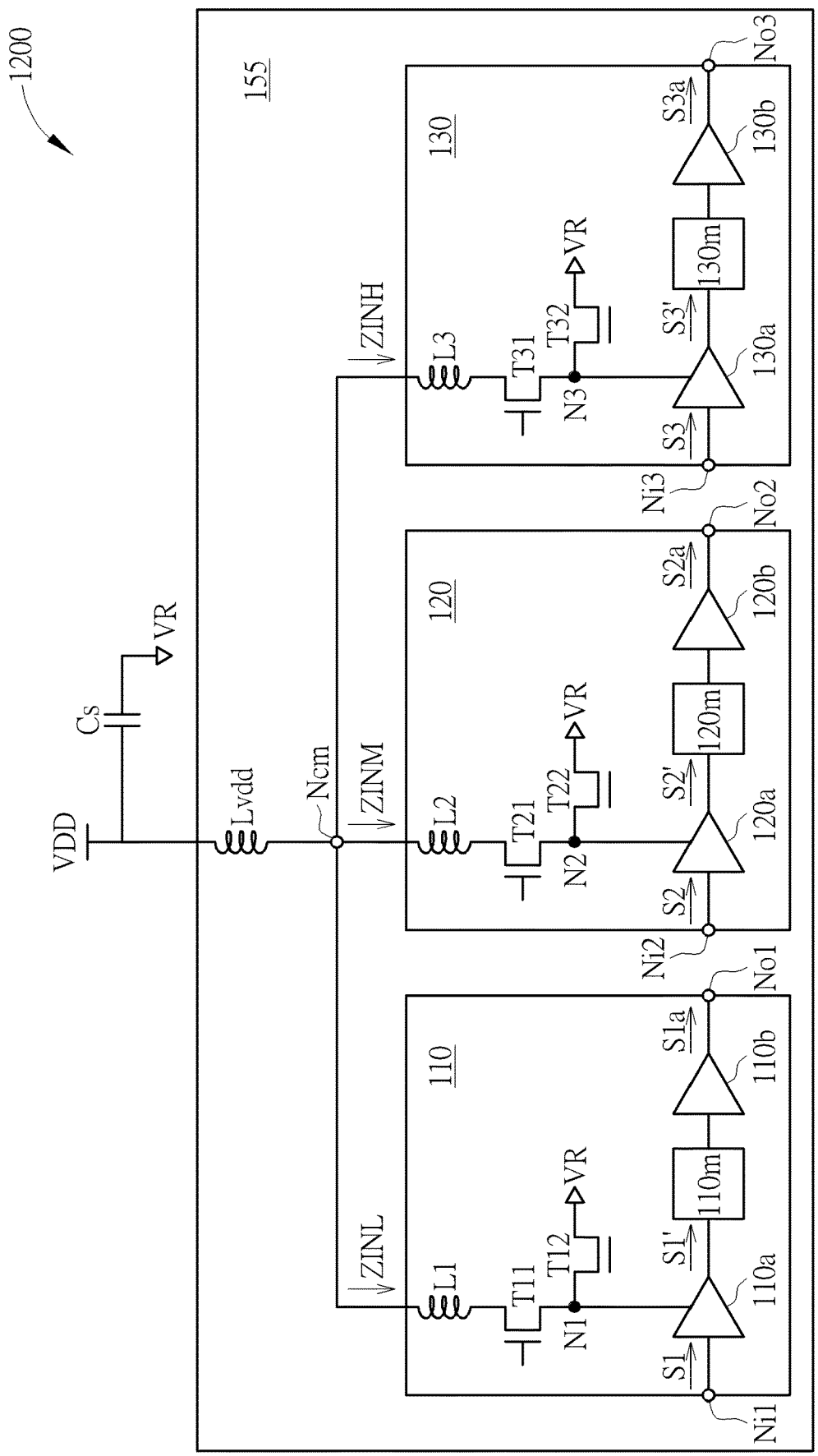
FIG. 12 illustrates an amplifier circuit according to another embodiment.

FIG. 12 illustrates an amplifier circuit 1200 according to another embodiment. The amplifier circuit 1200 can be similar to the amplifier circuit 1100 shown in FIG. 11; however, in amplifier circuit 1200, each of the amplifiers 110, 120 and 130 can further include a series switch and a shunt switch.

The amplifiers 110 can further include a series switch T11 and a shunt switch T12. The series switch T11 can be coupled between the inductor L1 and the first stage 110a of the amplifier 110. The shunt switch T12 can be coupled between a node N1 and the reference voltage terminal VR, where the node N1 is between the series switch T11 and the stage 110a.

Likewise, the amplifiers 120 can further include a series switch T21 and a shunt switch T22. The series switch T11 can be coupled between the inductor L2 and the first stage 120a of the amplifier 120. The shunt switch T22 can be coupled between a node N2 and the reference voltage terminal VR, where the node N2 is between the series switch T21 and the stage 120a. Likewise, the amplifiers 130 can further include a series switch T31 and a shunt switch T32. The series switch T31 can be coupled between the inductor L3 and the first stage 130a of the amplifier 130. The shunt switch T32 can be coupled between a node N3 and the reference voltage terminal VR, where the node N3 is between the series switch T31 and the stage 120a.

Each of the shunt switches T12, T22 and T32 is used for providing a path with low impedance. For example, when the amplifier 130 is in use, and the amplifiers 110 and 120 are unused, the shunt switches T12 and T22 can be turned on, and the shunt switch T32 can be turned off. In this scenario, each of the turned-on switches T12 and T22 can have a small resistance. The impedance ZINL can be determined by the inductor L1, the reactance of the series switch T11 and the resistance of the turned-on switch T12, and the influence of the matching circuit 110m on the impedance ZINL can be reduced. Likewise, by turning on the shunt switch T22, the influence of the matching circuit 120m on the impedance ZINM can be reduced. Since the structures and the components of the matching circuits 110m, 120m and 130m can vary a lot, the loading effect can be decreased by reducing the uncertainty brought by the matching circuit.

Regarding the series switches T11, T21 and T31, for example, when the amplifier 130 is in use, and the amplifiers 110 and 120 are unused, the series switches T11 and T21 can be turned off, and the series switch T31 can be turned on. According to experiments, each of the turned-off series switches T11 and T21 can provide a small capacitance, hence the measured impedances ZINL and ZINM can be effectively increased.

According to embodiments, each of the shunt switch T12, T22 and T32 can be selectively omitted. In an unused amplifier, the series switch has to be turned off, and the shunt switch can be selectively turned on or turned off.

Figure 13:
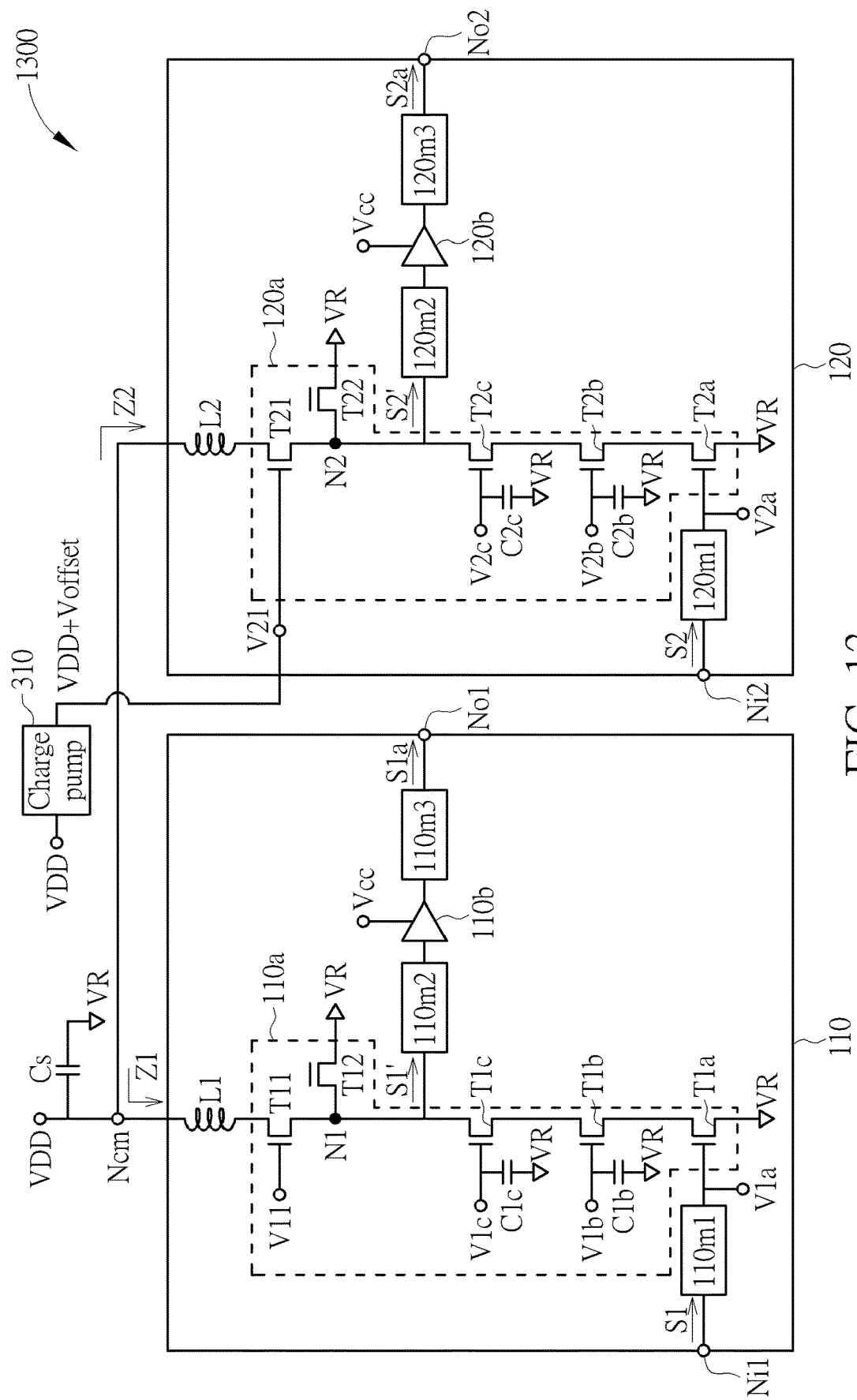
FIG. 13 illustrates an amplifier circuit according to another embodiment.

FIG. 13 illustrates an amplifier circuit 1300 according to an embodiment. The amplifier circuit 1300 can be similar to the amplifier circuits 1100 and 1200; however, in the example shown in FIG. 13, more details are provided. The amplifier circuit 1300 includes two power amplifiers 110 and 120 as an example, and embodiments are not limited thereto.

The amplifier circuit 1300 can include the power amplifier 110 and the second power amplifier 120. The power amplifier 110 can include the input terminal Ni1, the output terminal No1 and at least the first amplification stage 110a. The output terminal No1 can be used to output the first amplification signal S1a. The first amplification stage 110a can amplify the input signal S1 to generate the amplified input signal S1', and the second amplification stage 110b can amplify the amplified input signal S1' to generate an amplification signal S1a. The first amplification stage 110a of the first power amplifier 110 can include at least the first transistor T1a and the first switch T11. The first transistor T1a can include a control terminal, a first terminal and a second terminal, where the control terminal is coupled to the input terminal Ni1 for receiving the input signal S1, the first terminal is coupled to the output terminal No1 for outputting the amplified input signal S1a. The first switch T11 can be a series switch and include a first terminal and a second terminal coupled to the first terminal of the transistor T1a.

The second power amplifier can include the input terminal Ni2, the output terminal No2 and the first amplification stage 120a. The output terminal No2 can output the second amplification signal S2a. The first amplification stage 120a can amplify the input signal S2 to generate the amplified input signal S2', and the second amplification stage 120b can amplify the amplified input signal S2' to generate an amplification signal S2a. The first amplification stage 120a of the second power amplifier 120 can include at least the second transistor T2a. The transistor T2a can include a control terminal, a first terminal and a second terminal, where the control terminal is coupled to the input terminal Ni2 for receiving the input signal S2, and the first terminal is coupled to the output terminal No2 for outputting the amplified input signal S2a. The amplification signal S1a is generated using at least the amplified input signal S1, and the amplification signal S2a is generated using at least the amplified input signal S2.

As shown in FIG. 13, each of the first power amplifier 110 and the second power amplifier 120 can a multi-stage power amplifier including a plurality of amplification stages. As shown in FIG. 13, the first power amplifier 110 can further include the second amplification stage 110b coupled to the amplification stage 110a, and the amplification stage 110b can receive and amplify the amplified input signal S1' for generating the amplification signal S1a. Likewise, the second power amplifier 120 can further include the second amplification stage 120b coupled to the amplification stage 120a, and the amplification stage 120b can receive and amplify the amplified input signal S2' for generating the amplification signal S2a.

In FIG. 13, each of the amplifiers 110 and 120 includes two amplification stages; however, FIG. 13 merely provides an example, and each multi-stage power amplifier can include more stages according to embodiments.

As shown in FIG. 13, the first amplifier 110 can further include a switch T12. The switch T12 can include a first terminal coupled to the first terminal of the transistor T1a, and a second terminal coupled to the reference voltage terminal VR. For example, the reference voltage terminal VR can provide a predetermined low voltage or a ground voltage. As mentioned in FIG. 12, the switch T11 can be the series switch of the amplifier 110, and the switch T12 can be the shunt switch of the amplifier 110. Likewise, as shown in FIG. 13, the amplifier 120 can further include switches T21 and T22. The switch T21 can include a first terminal, and a second terminal coupled to the first terminal of the transistor T2a. The switch T22 can include a first terminal coupled to the first terminal of the transistor T2a, and a second terminal coupled to the reference voltage terminal VR. For example, the reference voltage terminal VR can provide a predetermined low voltage or a ground voltage.

In FIG. 13, the frequency band related to the input signal S1 can be different from the frequency band related to the input signal S2.

According to embodiments, when the amplifier 120 is use and the amplifier 110 is unused, the transistor T2a is in use to output the amplified input signal S2', and the switch T11 (e.g., series switch) of the amplifier 110 should be turned off to be a capacitor with a low capacitance for increasing the impedance Z1. The switch T12 (e.g., shunt switch) of the first power amplifier can be turned on to be a resistor with a low resistance for reducing the influence of the matching circuit 110m2 on the impedance Z1. The loading effect can hence be reduced.

According to embodiments, when a series switch (e.g., T11) is turned off, the capacitance of the series switch can be between 114 femtofarads (fF) to 226 femtofarads, where 1 femtofarad is $10^{-15}$ farads. When a shunt switch (e.g., T12) is turned on, the resistance of the shunt switch can be between 0.3 ohms to 5 ohms.

When the capacitance of the turned-off series switch of an unused amplifier is lower, the loading effect can be reduced to be lower. When the resistance of the turned-on shunt switch of an unused amplifier is lower, the loading effect can be reduced to be lower. However, the area of the switch, and the voltage drop caused by the series switch when the amplifier is in use should be considered.

According to embodiments, when the transistor T2a is in use for outputting the amplified input signal S2', the switch T21 (e.g., series switch) of the amplifier 120 should be turned on, and the switch T22 (e.g., shunt switch) of the amplifier 120 should be turned off.

According to embodiments, when the transistor T2a is in use to output the amplified input signal S2', the switch T21 is turned on, the voltage V21 applied to the control terminal of the switch T21 can be provided from a charge pump 310 and be substantially equal to the reference voltage VDD plus an offset voltage Voffset. Hence, in this scenario, it can be expressed as:

$$V21=VDD+Voffset.$$

For example, the offset voltage Voffset can be a positive voltage, so the reference voltage VDD plus the offset voltage Voffset can be higher than the reference voltage VDD. Hence, when the reference voltage VDD varies, the voltage V21 can vary accordingly to correctly turn on the switch T21. A shown in FIG. 13, the first terminal of the switch T21 can be coupled to the reference voltage terminal VDD. In the text, the reference voltage terminal VDD can provide the reference voltage VDD. The charge pump 310 can receive the reference voltage VDD for generating the voltage V21 being the first reference voltage VDD plus the offset voltage Voffset to turn on the switch T21. According to embodiments, the reference voltage VDD received by the charge pump 310 can be generated by an interior circuit of the amplifier circuit 1300.

Likewise, the voltage V11 applied to the control terminal of the switch T11 can be provided from the charge pump 310 or another charge pump and be substantially equal to the reference voltage VDD plus an offset voltage Voffset when the switch T11 is turned on.

According to embodiments, in FIG. 13, each of the switch T11 (e.g., series switch), the switch T12 (e.g., shunt switch), the switch T21 (e.g., series switch) and the switch T22 (e.g., shunt switch) can be formed using a p-type metal-oxide-silicon field-effect transistor (PMOS) or an n-type metal-oxide-silicon field-effect transistor (NMOS).

According embodiments, each amplification stage of the power amplifier 110 and the power amplifier 120 can include a plurality of transistors. The transistors of the each amplification stage can be connected to form a stacked structure. For example, as shown in FIG. 13, the amplification stage 110a of the power amplifier 110 can include the transistors T1a, T1b and T1c connected to form a stacked (cascode) structure. The transistor T1c can have a first terminal, a second terminal and a control terminal. The transistor T1b can have a first terminal coupled to the second terminal of the transistor T1c, a second terminal and a control terminal. The transistor T1a can have a first terminal coupled to the second terminal of the transistor T1b, a second terminal coupled to the reference voltage terminal VR, and a control terminal. Hence, the transistors T1c, T1b and T1a can form the stacked structure. Likewise, the amplification stage 120a of the power amplifier 120 can include the transistors T2a, T2b and T2c connected to form a stacked (cascode) structure.

According embodiments, the transistors of each amplification stage (e.g., each of 110a and 120a) of the power amplifiers 110 and 120 can be metal-oxide-semiconductor field-effect transistors (MOSFETs). According embodiments, the transistors of each amplification stage (e.g., each of 110a and 120a) of the power amplifiers 110 and 120 can be bipolar junction transistors (BJTs).

According to embodiment, in the amplifiers 110 and 120, each amplification stage can further include at least a capacitor coupled between the reference voltage terminal VR and a control terminal of one of the transistors of the amplification stage. For example, the reference voltage terminal VR can provide a predetermined low voltage or a ground voltage. For example, as shown in FIG. 13, the amplification stage 110a can include the capacitors C1b and C1c, the capacitor C1b can be coupled between the reference voltage terminal VR and the control terminal of the transistor T1b, and the capacitor C1c can be coupled between the reference voltage terminal VR and the control terminal of the transistor T1c. Likewise, the amplification stage 120a can include the capacitors C2b and C2c, the capacitor C2b can be coupled between the reference voltage terminal VR and the control terminal of the transistor T2b, and the capacitor C2c can be coupled between the reference voltage terminal VR and the control terminal of the transistor T2c. Each of the capacitors C1b, C1c, C2b and C2c can be an AC short capacitor coupled to the control terminal (e.g., gate terminal) of the transistor and be used to filter out noises and stabilize the voltage at the control terminal of the transistor.

In FIG. 13, the matching circuit 110m1 can be the input matching circuit of the amplifier 110 for impedance matching. The matching circuit 110m2 can be the inter-stage matching circuit of the amplifier 110 for impedance matching. The matching circuit 110m3 can include output matching network for impedance matching and the harmonic termination circuit for adjusting the output harmonics that dominate. The matching circuits 120m1, 120m2 and 120m3 can be similar to matching circuits 110m1, 110m2 and 110m3. As show in FIG. 13, the bias voltages V1a, V1b, V1c, V2a, V2b and V2c can be respectively applied to the control terminals of the transistors T1a, T1b, T1c, T2a, T2b and T2c.

In summary, by disposing the series switch and shunt switch in the power amplifier of a multi-mode multi-band amplifier circuit, the loading effect caused by an unused amplifier to an amplifier in use is effectively reduced. The requirement of the surface mounted device (e.g., the external capacitors and inductors mounted on the circuit board) is reduced, and the related cost is decreased. The performance of the amplifier circuit in broad frequency band is improved since the influence of the capacitor Cs shown in FIG. 11 to FIG. 13 is decrease. Hence, the difficulties in the field are reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit comprising:
   a first power amplifier, comprising:
      a first output terminal configured to output a first amplification signal; and
      a first amplification stage, the first amplification stage of the first power amplifier comprising:
         a first transistor comprising a control terminal configured to receive a first input signal, a first terminal coupled to the first output terminal and configured to output an amplified first input signal, and a second terminal; and
         a first switch comprising a first terminal, and a second terminal coupled to the first terminal of the first transistor; and
   a second power amplifier, comprising:
      a second output terminal configured to output a second amplification signal;

a second amplification stage, the second amplification stage of the second power amplifier comprising:
a second transistor comprising a control terminal configured to receive a second input signal, a first terminal coupled to the second output terminal and configured to output an amplified second input signal, and a second terminal; and
a third switch comprising a first terminal, a control terminal, and a second terminal coupled to the first terminal of the second transistor;
wherein when the second transistor is in use to output the amplified second input signal, the third switch is turned on, a voltage applied to the control terminal of the third switch is provided from a charge pump and is higher than a second reference voltage; and
the first terminal of the third switch is coupled to a second reference voltage terminal providing the second reference voltage.

2. The amplifier circuit of claim 1, wherein the first power amplifier further comprises:
a second switch comprising a first terminal coupled to the first terminal of the first transistor, and a second terminal coupled to a first reference voltage terminal.

3. The amplifier circuit of claim 2, wherein when the second transistor is in use to output the amplified second input signal, the first switch of the first power amplifier is turned off.

4. The amplifier circuit of claim 3, wherein when the second transistor is in use to output the amplified second input signal, the second switch of the first power amplifier is turned on.

5. The amplifier circuit of claim 3, wherein the second power amplifier further comprises:
a fourth switch comprising a first terminal coupled to the first terminal of the second transistor, and a second terminal coupled to the first reference voltage terminal.

6. The amplifier circuit of claim 5, wherein when the second transistor is in use to output the amplified second input signal, the third switch of the second power amplifier is turned on, and the fourth switch of the second power amplifier is turned off.

7. The amplifier circuit of claim 5, wherein each of the first switch, the second switch, the third switch and the fourth switch is formed using a p-type metal-oxide-silicon transistor or an n-type metal-oxide-silicon transistor.

8. The amplifier circuit of claim 1, wherein:
each of the first power amplifier and the second power amplifier is a multi-stage power amplifier including a plurality of amplification stages;
the first power amplifier further comprises a third amplification stage coupled to the first amplification stage of the first power amplifier and configured to receive and amplify the amplified first input signal; and
the second power amplifier further comprises a fourth amplification stage coupled to the second amplification stage of the second power amplifier and configured to receive and amplify the amplified second input signal.

9. The amplifier circuit of claim 8, wherein each amplification stage of the first power amplifier and the second power amplifier includes a plurality of transistors.

10. The amplifier circuit of claim 9, wherein the transistors of the each amplification stage of the first power amplifier and the second power amplifier are bipolar junction transistors.

11. The amplifier circuit of claim 9, wherein the transistors of the each amplification stage of the first power amplifier and the second power amplifier are metal-oxide-semiconductor field-effect transistors.

12. The amplifier circuit of claim 11, wherein the transistors of the each amplification stage are connected to form a stacked structure.

13. The amplifier circuit of claim 1, wherein a first frequency band related to the first input signal is different from a second frequency band related to the second input signal.

14. An amplifier circuit comprising:
a first power amplifier, comprising:
a first output terminal configured to output a first amplification signal; and
a first amplification stage, the first amplification stage of the first power amplifier comprising:
a first transistor comprising a control terminal configured to receive a first input signal, a first terminal coupled to the first output terminal and configured to output an amplified first input signal, and a second terminal; and
a first switch comprising a first terminal, and a second terminal coupled to the first terminal of the first transistor; and
a second power amplifier, comprising:
a second output terminal configured to output a second amplification signal; and
a second amplification stage, the second amplification stage of the second power amplifier comprising:
a second transistor comprising a control terminal configured to receive a second input signal, a first terminal coupled to the second output terminal and configured to output an amplified second input signal, and a second terminal;
wherein:
each amplification stage of the first power amplifier and the second power amplifier includes a plurality of transistors;
the transistors of the each amplification stage are connected to form a stacked structure;
the stacked structure of the each amplification stage of the second power amplifier comprises:
a first transistor comprising a first terminal, a second terminal and a control terminal;
a second transistor comprising a first terminal coupled to the second terminal of the first transistor of the stacked structure, a second terminal and a control terminal; and
a third transistor comprising a first terminal coupled to the second terminal of the second transistor of the stacked structure, a second terminal coupled to a reference voltage terminal; and
the each amplification stage further comprises:
a first capacitor coupled between the reference voltage terminal and the control terminal of the first transistor of the stacked structure; and
a second capacitor coupled between the reference voltage terminal and the control terminal of the second transistor of the stacked structure.

15. The amplifier circuit of claim 14, wherein the transistors of the each amplification stage of the first power amplifier and the second power amplifier are metal-oxide-semiconductor field-effect transistors.

16. An amplifier circuit comprising:
a first power amplifier, comprising:
a first output terminal configured to output a first amplification signal; and a first amplification stage, the first amplification stage of the first power amplifier comprising:
- a first transistor comprising a control terminal configured to receive a first input signal, a first terminal coupled to the first output terminal and configured to output an amplified first input signal, and a second terminal; and
- a first switch comprising a first terminal, and a second terminal coupled to the first terminal of the first transistor; and a second power amplifier, comprising:
- a second output terminal configured to output a second amplification signal; and
- a second amplification stage, the second amplification stage of the second power amplifier comprising:
  - a second transistor comprising a control terminal configured to receive a second input signal, a first terminal coupled to the second output terminal and configured to output an amplified second input signal, and a second terminal;

wherein:

each amplification stage of the first power amplifier and the second power amplifier includes a plurality of transistors;

the transistors of the each amplification stage are connected to form a stacked structure;

the stacked structure of the each amplification stage of the first power amplifier comprises:
- a first transistor comprising a first terminal, a second terminal and a control terminal;
- a second transistor comprising a first terminal coupled to the second terminal of the first transistor of the stacked structure, a second terminal and a control terminal; and
- a third transistor comprising a first terminal coupled to the second terminal of the second transistor of the stacked structure, a second terminal coupled to a reference voltage terminal; and the each amplification stage further comprises:
- a first capacitor coupled between the reference voltage terminal and the control terminal of the first transistor of the stacked structure; and
- a second capacitor coupled between the reference voltage terminal and the control terminal of the second transistor of the stacked structure.

17. The amplifier circuit of claim 16, wherein the transistors of the each amplification stage of the first power amplifier and the second power amplifier are metal-oxide-semiconductor field-effect transistors.

* * * * *